United States Patent
Samad et al.

(10) Patent No.: US 9,998,135 B2
(45) Date of Patent: Jun. 12, 2018

(54) METHOD AND APPARATUS FOR ANALOG TO DIGITAL ERROR CONVERSION WITH MULTIPLE SYMMETRIC TRANSFER FUNCTIONS

(71) Applicant: AnDAPT, Inc., San Jose, CA (US)

(72) Inventors: Maheen Samad, Sunnyvale, CA (US); Patrick J. Crotty, San Jose, CA (US); John Birkner, Woodside, CA (US); Herman Cheung, Cupertino, CA (US); Kapil Shankar, Saratoga, CA (US)

(73) Assignee: AnDAPT, INC., San Jose, CA (US)

( * ) Notice: Subject to any disclaimer, the term of this patent is extended or adjusted under 35 U.S.C. 154(b) by 0 days. days.

(21) Appl. No.: 15/673,234

(22) Filed: Aug. 9, 2017

(65) Prior Publication Data

US 2018/0048324 A1 Feb. 15, 2018

Related U.S. Application Data

(60) Provisional application No. 62/372,684, filed on Aug. 9, 2016.

(51) Int. Cl.
*H03M 1/12* (2006.01)
*H03M 1/10* (2006.01)
(Continued)

(52) U.S. Cl.
CPC ...... *H03M 1/1014* (2013.01); *H03K 19/0008* (2013.01); *H03K 19/017581* (2013.01)

(58) Field of Classification Search
CPC ........ H03M 1/1014; H03K 19/017581; H03K 19/0008
(Continued)

(56) References Cited

U.S. PATENT DOCUMENTS 5,138,318 A * 8/1992 Matsuzawa ........... H03F 3/3081
330/252
5,554,943 A * 9/1996 Moreland ........... H03F 3/45103
327/560
5,589,831 A * 12/1996 Knee ..................... H03M 1/363
341/155

OTHER PUBLICATIONS

Zhen Shaowei et al., "A digitally controlled PWM/PSM dual-mode DC/DC converter", Journal of Semiconductors, Nov. 2011, 7 pages, vol. 32, No. 11., State Key Laboratory of Electronic Thin Films and Integrated Devices, University of Electronic Science and Technology of China, Chengdu 610054, China.

* cited by examiner

*Primary Examiner* — Brian Young
(74) *Attorney, Agent, or Firm* — Innovation Counsel, LLP

(57) ABSTRACT

An analog-to-digital conversion (ADC) block includes: an amplifier block configured to receive two analog input signals and a primary-precision configuration signal and generate a first pair of differential signals by amplifying the two analog input signals according to a primary-precision gain that is programmably set by the primary-precision configuration signal; a configuration block configured to receive a fractional-precision configuration signal and generate a second pair of differential signals by amplifying the first pair of differential signals according to a fractional-precision gain that is programmably set by the fractional-precision configuration signal; and a differential analog-to-digital converter (ADC) including a voltage-controlled oscillator (VCO), two counters, and an error generator block. The VCO receives the second pair of differential signals and generates two pulse signals having frequencies that vary depending on a difference between the second pair of differential signals. Each of the two counters receives a respective pulse signal from the VCO and generate a digital counter value. The error generator block receives digital (Continued)

counter values from the two digital counters generates a digital conversion code corresponding to a difference between the digital counter values.

22 Claims, 18 Drawing Sheets

(51) Int. Cl.
*H03K 19/00* (2006.01)
*H03K 19/0175* (2006.01)

(58) Field of Classification Search
USPC .................................................. 341/155, 120
See application file for complete search history.

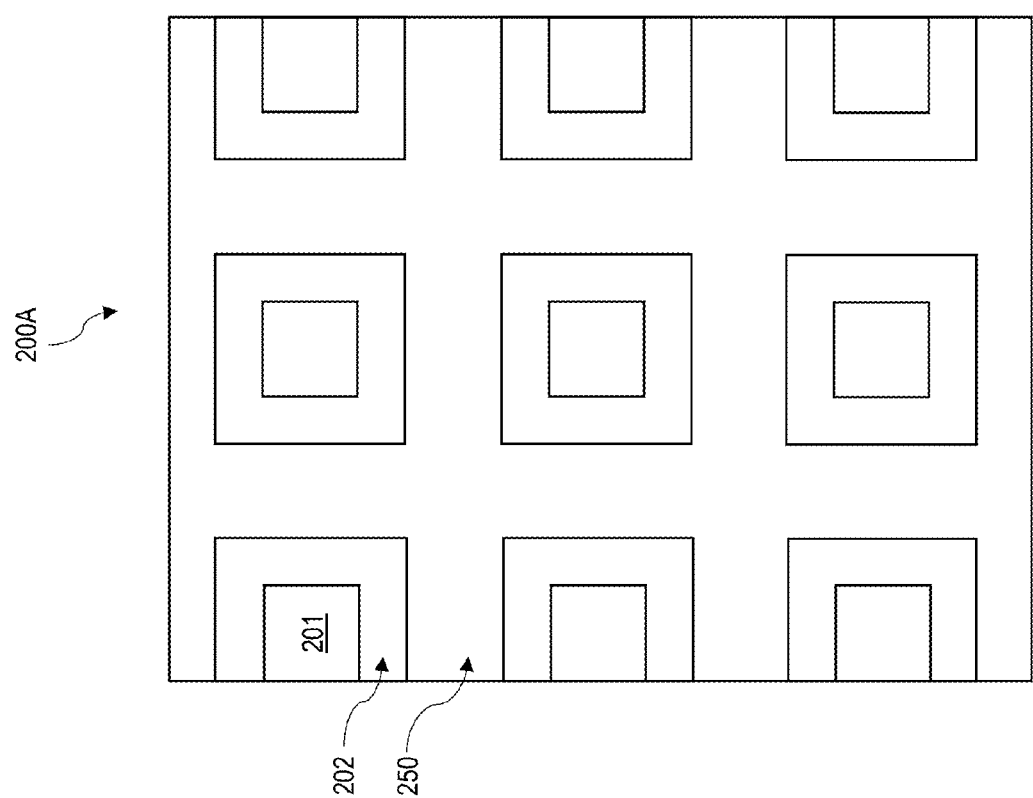

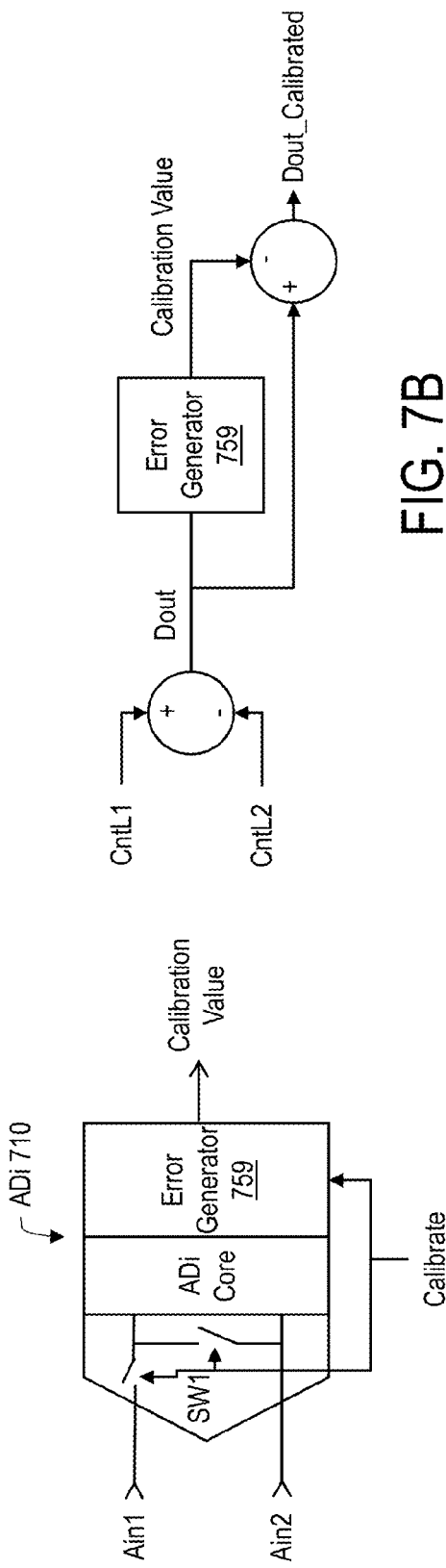
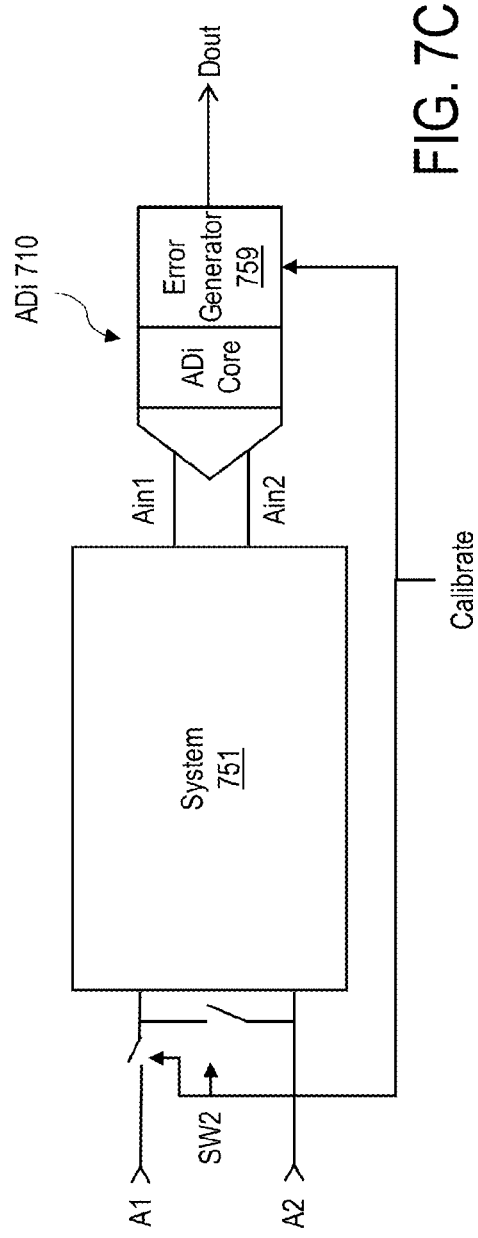
FIG. 7A
FIG. 7B
FIG. 7C

METHOD AND APPARATUS FOR ANALOG TO DIGITAL ERROR CONVERSION WITH MULTIPLE SYMMETRIC TRANSFER FUNCTIONS

CROSS-REFERENCE TO RELATED APPLICATION(S)

This application claims the benefits of and priority to U.S. Provisional Patent Application Ser. No. 62/372,684 filed Aug. 9, 2016, the disclosure of which is incorporated herein by reference in their entirety.

TECHNICAL FIELD

The present disclosure relates generally to programmable logic devices (PLDs), more particularly, to a system and method for converting an analog error signal to a digital error signal with multiple symmetric transfer functions.

BACKGROUND

Programmable logic devices (PLDs) such as programmable logic array (PLA) devices, programmable array logic (PAL) devices, and field-programmable gate arrays (FPGAs) have been in the market place for a long time. These PLDs can be programmed by users for a wide variety of applications and industries. Functional blocks have been integrated to expand the capabilities of the PLDs. These functional blocks can be digital and/or analog that are designed to perform specific functions to complement or supplement the programmable components of the PLDs.

PLDs can have internal elements or fabrics that are programmable and connected together to perform a specific function. More complex devices can add functional blocks to the programming fabrics. These functional blocks can be a combination of digital and analog circuitry, such as a serial interface, a voltage reference, a comparator, an analog-to-digital (A/D) converter, etc. Some devices can be optimized for speed, power, flexibility, complexity, and/or cost. These devices can interface with the external world via input/output (I/O) pins. These I/O pins can typically function up to 5V and sourcing/sinking current up to 50 mA.

Some power applications such as a power regulator and a power converter may require a higher voltage and/or a higher current that the devices and their I/O pins can handle. Users can add an external discrete high-voltage power MOSFET to an existing PLD to expand its application to high-voltage/current power applications. The discrete high-voltage power MOSFET requires another package, adding more cost and requiring more board space.

SUMMARY

An analog-to-digital conversion block includes: an amplifier block configured to receive two analog input signals and a primary-precision configuration signal and generate a first pair of differential signals by amplifying the two analog input signals according to a primary-precision gain that is programmably set by the primary-precision configuration signal; a configuration block configured to receive a fractional-precision configuration signal and generate a second pair of differential signals by amplifying the first pair of differential signals according to a fractional-precision gain that is programmably set by the fractional-precision configuration signal; and a differential analog-to-digital converter (ADC) including a voltage-controlled oscillator (VCO), two counters, and an error generator block. The VCO receives the second pair of differential signals and generates two pulse signals having frequencies that vary depending on a difference between the second pair of differential signals. Each of the two counters receives a respective pulse signal from the VCO and generate a digital counter value. The error generator block receives digital counter values from the two digital counters generates a digital conversion code corresponding to a difference between the digital counter values.

A method includes: receiving two analog input signals, a primary-precision configuration signal, and a fractional-precision configuration signal; generating a first pair of differential signals by amplifying the two analog input signals according to a primary-precision gain that is programmably set by the primary-precision configuration signal; generating a second pair of differential signals by amplifying the first pair of differential signals according to a fractional-precision gain that is programmably set by the fractional-precision configuration signal; and converting the second pair of differential signals to a digital conversion code corresponding to a difference between the two analog input signals using a differential analog-to-digital converter (ADC). The differential ADC includes a voltage-controlled oscillator (VCO), two counters, and an error generator block. The VCO included in the ADC receives the second pair of differential signals and generates two pulse signals having frequencies that vary depending on a difference between the second pair of differential signals. Each of the two counters receives a respective pulse signal of the two pulse signals from the VCO and generates a digital counter value. The error generator block receives digital counter values from the two counters and generates a digital conversion code corresponding to a difference between the two digital counter values.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the various embodiments given below serve to explain and teach the principles described herein.

FIG. 2A illustrates a schematic block diagram of an analog and digital adaptive platform, according to one embodiment;

FIG. 7A shows a simplified block diagram of an example ADi block for preforming a block-level signal calibration, according to one embodiment FIG. 7B shows a simplified block diagram of an example error generator for providing a block-level signal calibration, according to one embodiment FIG. 7C shows a simplified block diagram for providing a system-level signal calibration, according to one embodiment;

Figure 1:
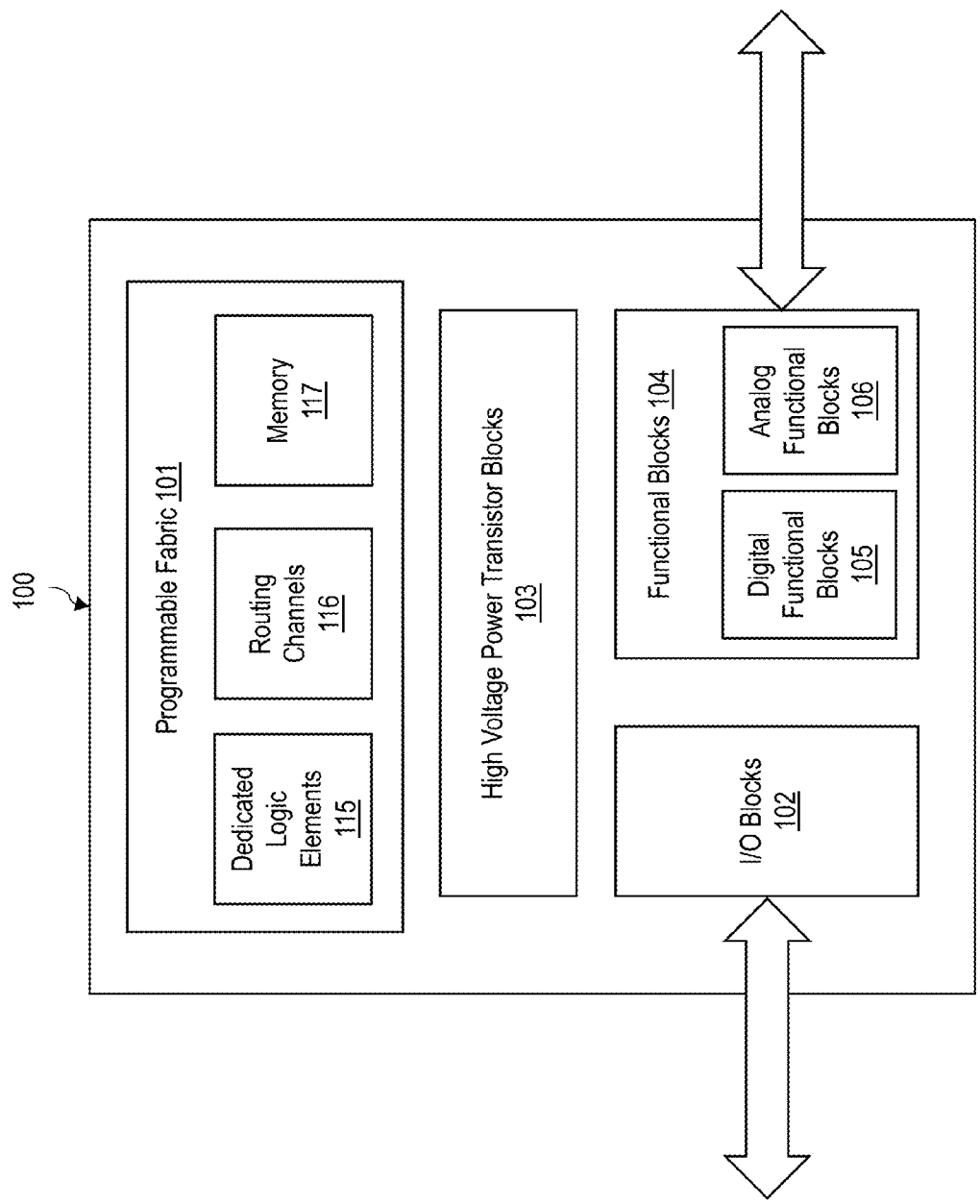
FIG. 1 shows a block diagram an example programmable logic device, according to one embodiment.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide a system and method for converting an analog error signal to a digital error signal with multiple symmetric transfer functions. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms presented herein are not inherently related to any particular computer or other apparatus. Various general-purpose systems, computer servers, or personal computers may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the disclosure as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity to an original disclosure, as well as to restricting the claimed subject matter. It is also expressly noted that the dimensions and the shapes of the components shown in the figures are designed to help to understand how the present teachings are practiced, but not intended to limit the dimensions and the shapes shown in the examples.

The present disclosure generally describes a programmable logic device (PLD) integrated with various building blocks for providing a power solution and minimizing cost to market and a board space. In particular, the present disclosure relates to an adaptive error digitizer block integrated in a PLD, herein also referred to as an ADi block or an ADC block. The ADi block receives two analog input signals and generates a digital output signal corresponding to a difference between the two analog input signals. The conversion of the difference between two analog input signals to the digital output signal may be one using multiple symmetric transfer functions.

The present PLD can provide a power management platform for high-voltage and high-power applications such as power management, power convertors, industrial control, automobile, etc. using one or more integrated power blocks. The present PLD can be used to integrate dissimilar rails on a single chip.

The PLD 100 can be configured as various types of regulators, switches, muxes, battery chargers, switching controllers, gate drivers, etc. Example configurations of the PLD 100 include, but are not limited to, a buck regulator (current or voltage mode), a boost regulator, a multiphase buck regulator (current or voltage mode), a buck-boost regulator (voltage mode), a source side regulator, a drain-side regulator, a push-pull DDR regulator, a load switch, a battery charger (trickle constant current or constant voltage, power path).

Each of the power blocks integrated in the present PLD has an on-demand topology for use in various applications. The present PLD can lower the power consumption by on-demand power on/off and sequencing rails, and on-demand monitoring to handle throttle conditions and marginal loads. In one embodiment, the present PLD can be configured as an on-demand multiple point-of-load (POL) integrator in various forms of power converters such as a point-of-load (POL) converter, a POL regulator, a POL module, and a POL system. Depending on a target application, the PLD can be programmed to function as an integrator combining one or more of a buck regulator (either current or voltage mode), a boost regulator, a buck-boost regulator, a low drop-out (LDO) regulator, a load switch, a mux, a battery charger, an external switching controller, and a gate driver. The PLD can also be programmed to function as a pulse width modulator (PWM) for providing constant current (CC) in a current mode or a constant voltage (CV) in a voltage mode, a pulse frequency modulator (PFM), or a pulse skipping modulator (PSM).

The present PLD can integrate one or more applications targeted for dissimilar rails to reduce a board size and lower a package cost. The present PLD enables a telemetry across different rails using one or more generic interfaces such as general-purpose input/output (GPIO), I2C interface, and serial peripheral interface (SPI) over the digital and analog I/O pins that can include physical pads. Using one or more of these interfaces or over a power management bus (e.g., PMBus™), the present PLD can communicate with an external device for a telemetry and a remote control. The present PLD can use the telemetry and the remote control for creating and integrating multiple dissimilar POLs. The present PLD can provide digital multiphase operation, for example, auto align/spread phases.

FIG. 1 shows a block diagram an example programmable logic device (PLD), according to one embodiment. The PLD 100 includes a programmable fabric 101, one or more I/O blocks 102, one or more high voltage power transistor blocks 103, and one or more functional blocks 104. In some embodiments, the PLD 100 is referred to as a power management integrated circuit (PMIC). The PMIC can convert one or more low power voltage inputs to one or more high power voltage outputs or convert one or more high voltage inputs to one or more low power voltage outputs.

The programmable fabric 101 includes a number of uncommitted programmable logic elements including one or more dedicated logic elements 115 and routing channels 116. The dedicated logic elements 115 can include a plurality of flip flops and logic gates. The dedicated logic elements 115 and the routing channels 116 of the programmable fabric 101 can be programmed to selectively and programmably connect the I/O blocks 102, the high voltage power transistor blocks 103, and the dedicated logic elements 115 via the routing channels 116 to form one or more dedicated functions.

The programmable fabric 101 can include a memory 117 including a volatile memory (e.g., a static random-access memory (SRAM)), a non-volatile memory (e.g., a flash memory), or both. The memory 117 may include one or more look-up tables for digital compensation.

The I/O blocks 102 can include one or more digital and/or analog inputs and output buffers. Each of the I/O blocks 102 can receive signals from and transmit signals to an external device in a configurable voltage and current. In one embodiment, the I/O blocks 102 can handle signals of a low voltage (up to 5V) and low current (up to 50 mA).

The PLD 100 can include any number of high voltage power transistor blocks, for example, four, eight, and twelve depending on a size of the chip and requirement for an intended application. The high voltage power transistor blocks 103, herein also referred to as scalable integrated MOSFET (SIM) blocks, can be configured and programmed to be a constituent block or element of a more complex circuit or device. In one embodiment, the high voltage power transistor blocks 103 can support voltages ranging from 12V to 80V and current up to 12 A. The voltage and current limits that the high voltage power transistor blocks 103 can support may vary depending on an intended power application and the process technology used for manufacturing the PLD 100. According to one embodiment, the high voltage power transistor blocks 103 can integrate both n-channel and p-channel FETs.

According to one embodiment, the source and the drain of each the high voltage power transistors in the high voltage power transistor blocks 103 can be connected to external circuits and/or devices. The I/O pins of the I/O blocks 102 are primarily used for interfacing digital and analog sensory signals to and from an external device or component, and may not include the source and drain (or boost pin) of the high voltage power transistors. The presence of one or more high voltage power transistors on the same chip can provide flexible configurations of the PLD 100 by programming the programmable fabric 101. For example, different high voltage power transistors on the same chip can connect to different external power rails or sensor hubs. In another example, the high voltage power transistors can be externally connected in series via the source and the drain of the high voltage power transistors. The programmable fabric 101 can be programmed to connect the I/O blocks 102, the high voltage power transistor blocks 103, and the integrated logic elements 115 using the programmable routing channels 116 in various configurations to accommodate a wide range of power applications.

The functional blocks 104 can include one or more of digital functional blocks 105, analog functional blocks 106, or a combination of both. A digital functional block 105 can provide dedicated functions such as a serial interface, a communication protocol, and an application-specific control function. An analog functional block 106 can be an analog-to-digital converter (ADC), a comparator, a sensor, an amplifier, a voltage reference, a digital-to-analog converter (DAC), etc. The parameters of each of these functional blocks 104 such as a gain, a reference voltage, a frequency, a resolution can be configured by the programmable fabric 101. In addition, the programmable fabric 101 can programmably connect different functional elements within the functional blocks 104. Some of the functional blocks 104 such as a reference voltage can be available via external pins of the I/O blocks 102.

According to one embodiment, the programmable fabric 101 can take a form of a field programmable gate array (FPGA). The FPGA contains an array of programmable logic blocks (e.g., the dedicated logic elements 115) and reconfigurable interconnects (e.g., the routing channels 116) to programmably wire the logical blocks together using the reconfigurable interconnects. The logic blocks may include simple logic gates like AND gates and XOR gates and flip-flops or more complex blocks such as memory elements. The logic blocks and the reconfigurable interconnects can be configured to perform complex combinational functions in conjunction with the functional blocks 104.

According to one embodiment, the programmable fabric 101 may include a digital fabric and an analog fabric. The digital fabric corresponds to a portion of the programmable fabric 101 that provides digital interfaces among the constituent blocks including the I/O blocks 102, the high voltage power transistor blocks 103, and the digital functional blocks 105. For example, the digital fabric can provide the connectivity among the integrated analog blocks, digital logic elements, timers, I/Os, etc. The analog fabric corresponds to a portion of the programmable fabric 101 to provide analog interfaces with one or more external telemetry and sensor blocks, an I2C interface, an SPI interface, etc.

According to one embodiment, a high voltage power transistor implemented in the high voltage power transistor blocks 103 is a software-defined and programmable, configurable, optimizable, and scalable power MOSFET. The PLD 100 including such power MOSFETs can accelerate time to market for new products and standards and achieve a competitive response while lowering the capital and operational expenditure, and inventory. The programmability of the present PLD can provide flexibility in design and facilitate the implementation of user-configurable and field-programmable solutions and topologies in a developmental stage of a new product as well as in a commercialization stage for providing optimizable solutions to customers by offering flexible solutions depending on the needs and requirements of a target application.

The present PLD includes one or more analog functional blocks that are adaptive for providing various user-configurable analog functions. The adaptive analog blocks are wrapped with respective signal wrappers on the programmable fabric. The programmable fabric provides a programmable environment to build user-configurable custom analog functions by digitally or combining one or more adaptive analog blocks by selectively and programmably interconnecting and combining the signal wrappers that provide interface to the adaptive analog blocks. The signal wrappers of the adaptive analog blocks eliminate the need to directly interconnect and/or interface analog blocks in an analog fashion with a variety range of voltages, currents, common mode, isolation, noise isolation issues, or the like. Using the present adaptive analog blocks, analog functions can be readily built on demand targeting specific applications while meeting the requirements for the target applications.

According to one embodiment, the present disclosure provides an analog and digital adaptive platform for implementing various analog functions using adaptive analog blocks that are configurable and programmable in a digital domain. The adaptive analog blocks that are wrapped with signal wrappers can provide ease of fabrication and packaging various custom analog functions in a small chip size with a low cost compared to conventional analog ICs. The present adaptive platform can provide flexibility and adaptability for various circuit designs and implementing on-demand analog functions adaptable to various applications on a single chip.

Examples of analog functions that the present adaptive platform can provide include, but are not limited to, switching converters, linear regulators, load switches, battery chargers, and external switching controllers. Beyond power applications, a broad spectrum of applications that the present adaptive platform is applicable to includes Internet of Things (IoT) devices, drones, electric vehicles (EVs), robotics, and various industrial applications utilizing external sensors for proximity, motion, position, tachometer, pitch, axis, yaw, light, pressure, temperature, humidity. The signal wrapper of the present adaptive platform can provide a digital PID control to various analog actuators including, but not limited to, DC motors, servo motors, stepper motors, motion control, breakers, fan controllers.

FIG. 2A illustrates a schematic block diagram of an analog and digital adaptive platform, according to one embodiment. The analog and digital adaptive platform 200A includes a plurality of analog and digital adaptive blocks 201 interconnected with signal wrappers 202 on a programmable fabric 250. Referring to FIG. 1, the adaptive blocks 201 correspond to any of the high voltage power transistor blocks 103, the digital functional blocks 105, and the analog functional blocks 106. Each of the adaptive blocks 201 arranged on the programmable fabric 250 is user-configurable and programmable by the coupled signal wrapper 202 to provide a user-configurable function for a target application or one or more circuit components of a target application.

A signal wrapper 202 provides an interface circuitry required for the coupled adaptive block 201 to interconnect with another adaptive block 201 and/or an I/O block (e.g., I/O block 102 of FIG. 1) via the programmable fabric 250. According to one embodiment, the analog and digital adaptive platform 200A includes a predetermined number of adaptive blocks 201. Examples of the adaptive blocks 201 include, but are not limited to, an analog-to-digital converter (ADC) block, a comparator block, a memory block, a pulse-width modulation (PWM) block, a voltage reference block, and a timer block. In conjunction with one or more programmable analog and digital input/output (I/O) blocks (e.g., the I/O blocks 102 of FIG. 1), these adaptive blocks 201 can be programmably configured to build a variety of analog circuitry for various applications via the programmable fabric 250.

According to one embodiment, a signal wrapper 202 can include both a digital wrapper for providing interfaces for digital signals and an analog wrapper for providing interfaces for analog signals to the corresponding adaptive blocks 201. The programmable fabric 250 can include a digital fabric and an analog fabric. In this case, the digital wrapper of the signal wrapper 202 interfaces with the digital fabric of the programmable fabric 250, and the analog wrapper of the signal wrapper 202 interfaces with the analog fabric of the programmable fabric 250.

According to one embodiment, each of the adaptive blocks 201 or a combination of multiple adaptive blocks 201 is programmed over the programmable fabric 250 to build a variety of analog circuitry for various power applications. Examples of such power applications include, but are not limited to a switching converter, a linear regulator, a load switch, a sensor, a battery charger, and an external switching controller. According to other embodiments, each of the adaptive blocks 201 or a combination of multiple adaptive blocks 201 is programmably configured to build a variety of analog circuitry for various non-power applications. Examples of non-power applications include, but are not limited to, an Internet of Things (IoT) device, a drone, an electric vehicle (EV), a robot, and various industrial applications utilizing one or more external sensors for sensing proximity, motion, position, tachometer, pitch, axis, yaw, light, pressure, temperature, humidity, etc. In conjunction with the adaptive blocks 201 and one or more of functional blocks (e.g., the functional blocks 104 of FIGS. 1) and I/O blocks (e.g., the I/O blocks 102 of FIG. 1), the signal wrappers 202 of the analog and digital adaptive platform 200A can provide a digital proportional-integral-derivative (PID) control to various analog actuators including, but not limited to, a DC motor, a servo motor, a stepper motor, a motion control, breakers, and a fan controller.

Figure 2B:
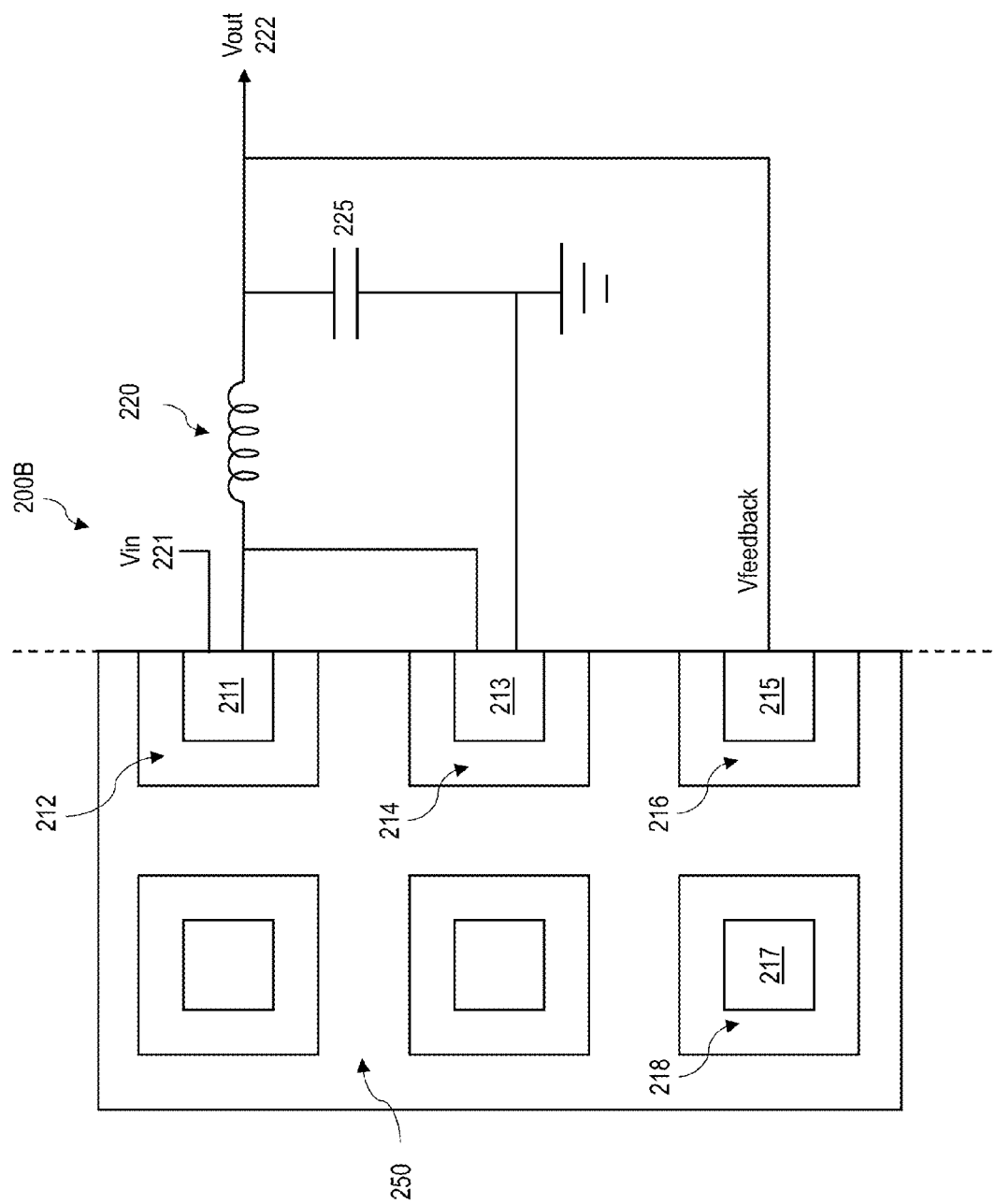
FIG. 2B illustrates an example of the analog and digital adaptive platform of FIG. 2A configured as a hysteretic mode buck switching converter, according to one embodiment.

FIG. 2B illustrates an example of the analog and digital adaptive platform of FIG. 2A configured as a hysteretic mode buck switching converter, according to one embodiment. The hysteretic mode buck switching converter 200B may also be referred to as a bang-bang buck switching converter. The hysteretic mode buck switching converter 200B is a DC-to-DC step-down power converter that converts an input voltage Vin 221 to an output voltage Vout 222 that is lower than the input voltage. The output current may be stepped up while the input voltage is stepped down. The hysteretic mode buck switching converter 200B can provide an efficient power conversion compared to a linear regulator that lowers the input voltage by dissipating power as heat without stepping up the output current.

The analog and digital adaptive platform 200B can be an example of the analog and digital adaptive platform 200A shown in FIG. 2A. For example, the adaptive blocks 211, 213, 215 and 217 are instances of the adaptive blocks 201 of FIG. 2A, the signal wrappers 212, 214, 216, and 218 are instances of the signal wrapper 202 of FIG. 2A. Each of the adaptive blocks 211, 213, 215 and 217 can be one of a comparator block, a memory block, a PWM block, a voltage reference block, and a timer block.

In the present example, the adaptive block 215 is a comparator block. According to one embodiment, the comparator block is included in the analog functional blocks 106 of FIG. 1. The adaptive blocks 211 and 213 drive a filter including an inductor 220 and a capacitor 225 in a synchronous mode. The feedback voltage, $V_{feedback}$, of the filter output 222 (e.g., 1.0V, 4 A) is connected to the comparator block 215. Various internal connections and routing channels are configured to interconnect the adaptive blocks 211, 213, 215 and 217. For example, the adaptive block 217 and the adaptive block 215 are interconnected using the signal wrapper 218 that provides a digital interface to the adaptive block 217, and the signal wrapper 216 that provides a digital interface to the adaptive block 215 via the programmable fabric 250. In a similar fashion, the adaptive block 217 and the adaptive block 213 can be interconnected with the signal wrapper 218 and signal wrapper 214, and the adaptive block 217 and the adaptive block 211 can be interconnected with the signal wrapper 218 and the signal wrapper 212 via the programmable fabric 250. In this example, the adaptive blocks 211, 213, 215 and 217 are configured as a hysteretic mode buck switching converter to provide a stepped-down voltage output.

Figure 3A:
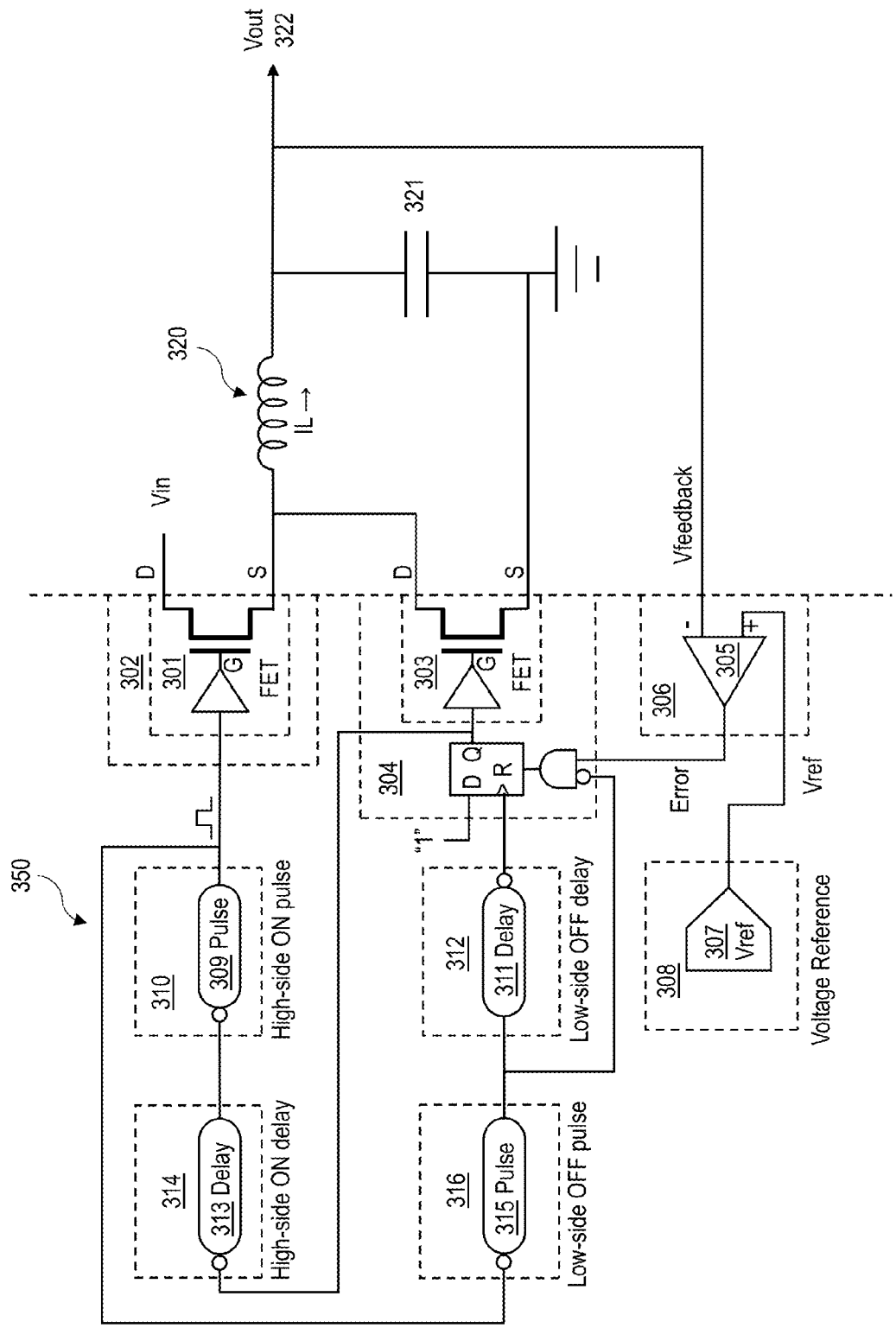
FIG. 3A illustrates a schematic diagram of an example hysteretic mode buck switching converter, according to one embodiment.
Figure 3B:
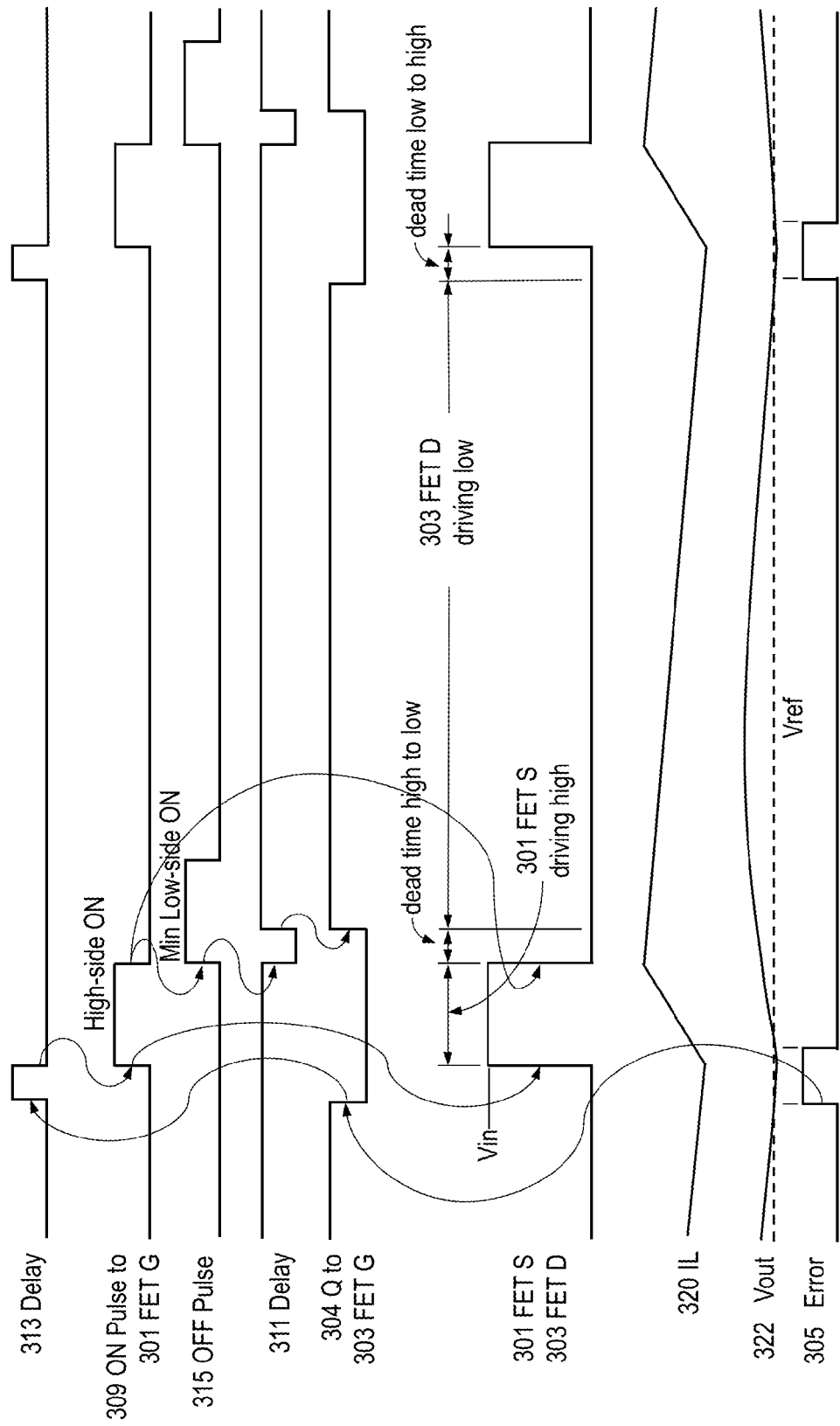
FIG. 3B is a signal diagram for the example hysteretic mode buck switching converter of FIG. 3A.

FIG. 3A illustrates a schematic diagram of an example hysteretic mode buck switching converter, according to one embodiment. The hysteretic mode buck switching converter shown in FIG. 3A may also be referred to as a bang-bang buck switching converter. FIG. 3B is a signal diagram for the example hysteretic mode buck switching converter of FIG. 3A. Although the present example shows an example of the analog and digital adaptive platform configured as a hysteretic mode buck switching converter, it is understood that the present adaptive platform can be configured as other devices including, but not limited to, a voltage mode buck switching converter, a current mode buck switching converter, a boost regulator, a buck-boost regulator, a low drop-out (LDO) regulator, a load switch, a mux, a battery charger, an external switching controller, a gate driver, and an integrator combining one or more thereof.

The programmable fabric can include a plurality of adaptive blocks, 301, 303, 305, 307, 309, 311, 313, and 315, each of which wrapped with respective signal wrappers 302, 304, 306, 308, 310, 312, 314, and 316. Among the adaptive blocks, the adaptive blocks 301 and 303 are high voltage power transistor blocks, the adaptive block 305 is a comparator block, the adaptive blocks 309, 311, 313, and 315 are timer blocks, and the adaptive block 307 is a voltage reference block.

Each of the high voltage power transistor blocks (e.g., the high voltage power transistor blocks 301 and 303) can be programmed for a specific target application and configured as, for example, but not limited to, a switcher, a linear operator, a current sense, and a protector. In the present example, the high voltage power transistor blocks 301 and 303 are programmed and configured as a switcher driving a high current output.

The comparator block 305 is configured to compare a voltage difference between an internal reference from the voltage reference block 307 and an external analog I/O signal $V_{feedback}$.

A timer block (e.g., the timer blocks 309, 311, 313, and 315) can be programmed to generate nanosecond, microsecond, and millisecond delays or pulses. The timer block can provide a precision dead-time control for improved efficiency. In the present example, the timer blocks 309 and 315 provide a constant-on-time pulse, and the timer blocks 311 and 313 are timers with a fixed delay specified by configuration.

A voltage reference block (e.g., the voltage reference block 307) can be used to provide a digitally-adjustable precision voltage reference. The voltage reference block can also provide protection for over current (OCP), over voltage (OVP), over temperature protection (OTP), under voltage-lockout (UVLO) references. In the present example, the voltage reference block 307 provides a fixed voltage reference specified at configuration, which provides the desired output voltage, $V_{ref}$.

The high voltage power transistor blocks 301 and 303 can drive the filter inductor 320 and the capacitor 321 in a synchronous mode as described in the signal diagram of FIG. 3B. The feedback voltage, $V_{feedback}$, from the filter output 322, $V_{out}$, is externally connected to the comparator block 305. The comparator block 305 compares the feedback voltage $V_{feedback}$ with a reference voltage, $V_{ref}$ to produce an error signal, Error=true if $V_{ref} \geq V_{feedback}$, or false if $V_{ref} < V_{feedback}$. The reference voltage, $V_{ref}$ is supplied from the voltage reference block 307 interconnected with the signal wrapper 308 and the signal wrapper 306 via the programmable fabric 350.

When the error signal 305 is true, the D-type flip-flop in the signal wrapper 304 is reset to turn off the high voltage power transistor block 303 and start the delay timer block 313. After this delay, the timer block 309 generates a constant-on-time pulse to turn on the high voltage power transistor block 301 through the connection made with signal wrapper 310 and signal wrapper 302 via the programmable fabric 350. The high voltage power transistor block 301 drives the inductor 320 to charge the output capacitor 321. When the pulse is completed, the falling edge of the pulse starts the minimum low-side ON pulse of the timer block 315 and sets the D-type flip-flop in the signal wrapper 304 after a fixed delay determined by the timer block 311 as shown in the signal diagram of FIG. 3B through the connection established with the signal wrapper 312 and the signal wrapper 304, and the connection established with the signal wrapper 310 and the signal wrapper 316 via the programmable fabric 350. The fixed delay is specified to ensure that the high-drive voltage power transistor block 301 is off, dead time, before the low-drive high voltage power transistor block 303 is turned on, preventing momentary shoot-through current as shown in the signal diagram of FIG. 3B. The D-type flip-flop in the signal wrapper 304 turns on the high voltage power transistor block 303 driving the inductor 320 to discharge the output capacitor 321.

The next cycle begins by first tuning off the low-side high voltage power transistor block 303 with a fixed delay reset pulse from the timer block 313 where the fixed delay is specified to ensure that the low-drive high voltage power transistor block 303 is off, dead time, before the high-drive voltage power transistor block 301 is turned on by the timer block 309, again, preventing momentary shoot-through current as shown in the signal diagram of FIG. 3B.

Figure 4:
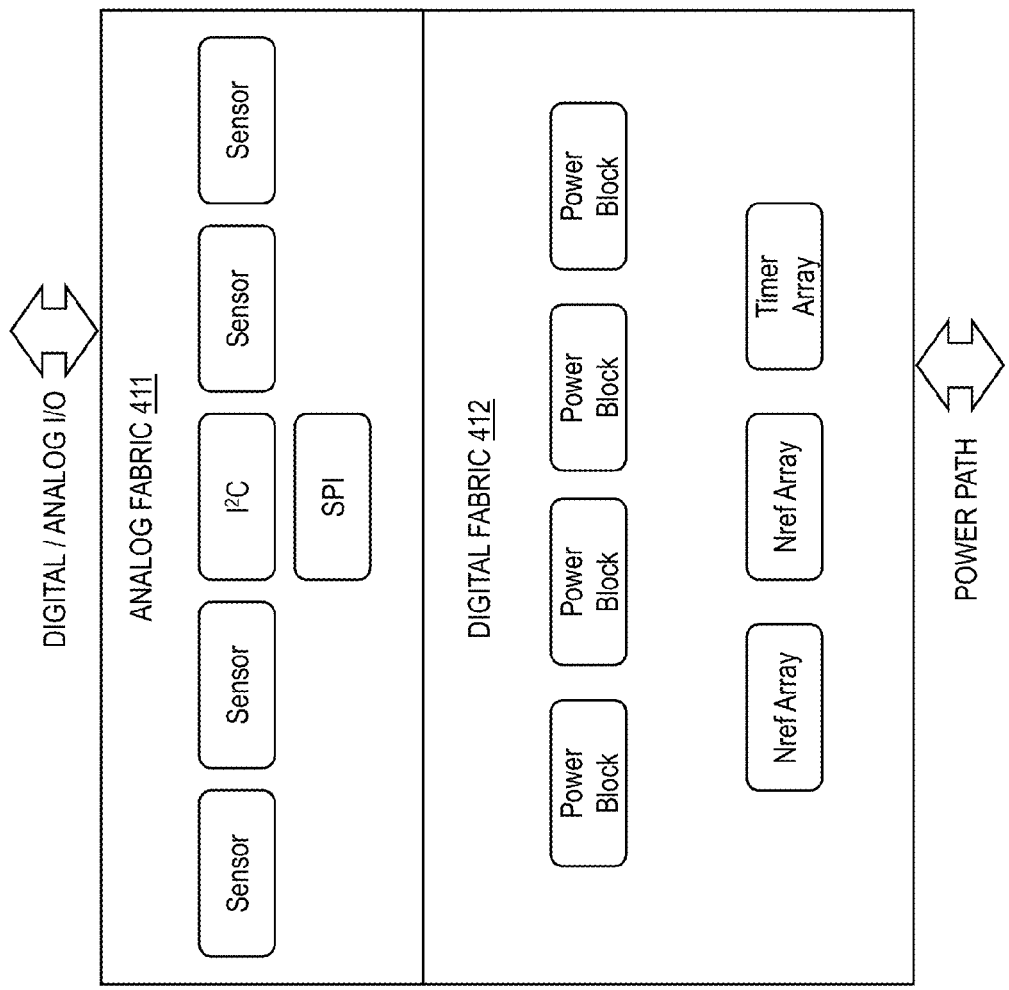
FIG. 4 shows a block diagram of an exemplary programmable logic device, according to one embodiment.

FIG. 4 shows a block diagram of an exemplary programmable logic device, according to one embodiment. The programmable fabric 101 of FIG. 1 may include an analog fabric 411 and a digital fabric 412. The analog fabric 411 corresponds to a portion of the programmable fabric 101 to provide analog interfaces with one or more external telemetry and sensor blocks, an I2C interface, an SPI interface, etc. The digital fabric 412 corresponds to a portion of the programmable fabric 101 that provides digital interfaces among the constituent blocks including the high voltage power transistor blocks 103, and the digital functional blocks 105 including a voltage reference (Nref array) and a timer array. For example, the digital fabric 412 can provide a power path and the connectivity among the integrated analog blocks, digital logic elements, timer arrays, I/O blocks, etc.

It is noted that FIG. 4 is only an example of the present PLD, and it is understood that the present PLD can include any number of power and sensor blocks, for example, four, eight, and twelve power and sensor blocks, and any type of digital and/or analog I/O interfaces without deviating from the scope of the present disclosure.

The present PLD can provide a software-defined and programmable, configurable, and optimizable power MOSFET. The present PLD including software-defined, programmable, and scalable power MOSFETs can accelerate time to market optimizable for new products and standards, accelerate competitive response, lower capital expenditure, operational expenditure, and inventory. The programming and configurability of the present PLD can be easily used to implement new ideas, solutions, and topologies.

The software component of the PLD can be programmed to configure various components, elements, and functions the PLD to configure the PLD as various types of regulators, switches, muxes, battery chargers, switching controllers, gate drivers, etc. Exemplary applications of the present PLD include, but are not limited to, a buck regulator (current or voltage mode), a boost regulator, a multiphase buck regulator (current or voltage mode), a buck-boost regulator (voltage mode), a source side regulator, a drain-side regulator, a push-pull DDR regulator, a load switch, a battery charger (trickle constant current or constant voltage, power path).

Figure 5:
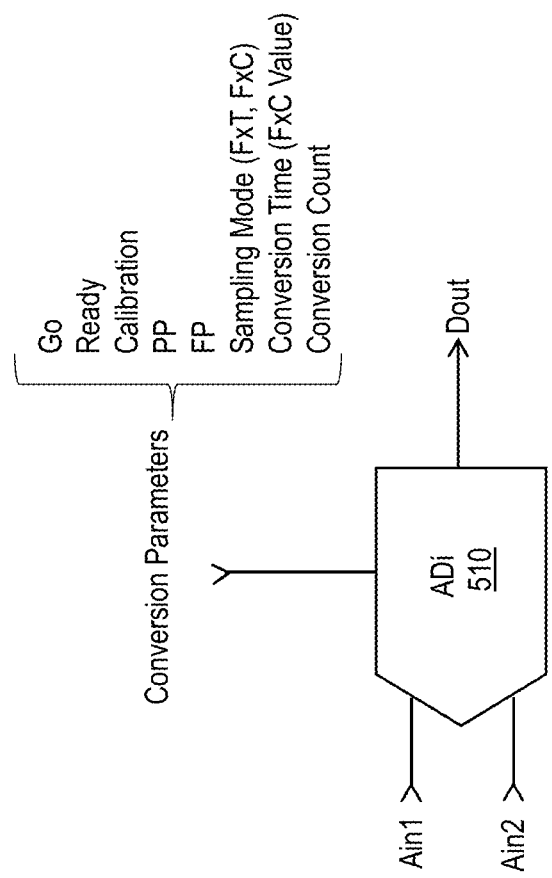
FIG. 5 shows a symbolic block diagram of an example ADi block, according to one embodiment.

FIG. 5 shows a symbolic block diagram of an example ADi block, according to one embodiment. The ADi block 510 is a differential digitizer and can include multiple symmetric transfer functions for providing fast and efficient analog-to-digital conversion. The multiple symmetric transfer functions of the ADi block 510 can cover a wide range of analog input signals (e.g., voltage input signals) using a plurality of oscillators and provide a desired digital output signal with a chosen tight precision. The digital output signal of the ADi block 510 can be a digitized error signal that can be used as an input to a memory block of the PLD to generate a PWM signal for driving a switch of a high voltage power transistor integrated in the PLD. The ADi block 510 can receive analog inputs such as external analog I/O signals or analog signals output from internal/external references of the PLD. For example, the ADi block 510 can be used as a voltage sense block or a current sense block. The ADi block 510 can generally be used for data conversion inside the PLD; however, the ADI block 510 can be implemented as a standalone analog-to-digital data converter to be externally coupled to a PLD. Depending on a desired specification and characteristics, the ADi block 510 can be customized to have a desirable silicon area, cost, and power consumption by using various circuit components, integrations, and layouts.

In the present example, the ADi block 510 receives two analog inputs Ain1 and Ain2 and provide a digital output signal Dout indicating a difference (or an error) between the two analog inputs Ain1 and Ain2. The ADi block 510 also receives one or more conversion parameters including, but not limited to, a Go signal (or a trigger signal), a Ready signal, a Calibration signal, a primary precision (PP) configuration signal, a fractional precision (FP) configuration signal, a sampling mode (e.g., a fixed time mode (FxT) or a fixed count (FxC) mode), and a fixed count (FxC) value. Depending on a difference between the two analog inputs Ain1 and Ain2, the digital output signal Dout can indicate a positive error or a negative error. The ADi block 510 can also provide a digital output signal Dout to the digital fabric of the programmable fabric. The digital output signal Dout can have a predetermined precision, for example, a 10-bit precision. The ADi block 510 can pair with a sensor block (e.g., sensor block of FIG. 4) integrated in the analog fabric of the PLD and convert analog sensor signals to a configurable-precision digital output signal. In this case, the differential signal ADi block 510 can have only one analog input, and the second analog input can be set to zero for single-ended analog signal sensing. The configurable-precision digital output can be used for further digital processing or fed to another adaptive block of the PLD.

According to one embodiment, the ADi block 510 has a differential multiplicity architecture including a front-end amplifier and multiple back-end voltage-controlled oscillators (VCOs). Furthermore, the sampling methodology and circuitry of the ADi enables a multiplicity of data conversion precision, conversion time, and sample window integration. A user can programmably adjust precision settings for the front-end amplifier and the back-end VCOs. Each of the back-end VCOs can cover a different precision/range of the analog inputs. The differential multiplicity architecture of the ADi block 510 can provide a digital output via the selected back-end VCO (e.g., a high-precision VCO or a low-precision VCO) that can match the signal range and precision requirements of the analog input signals. In some embodiments, more than one back-end VCOs may be used to generate a digital output to cover a wide range of the analog input signals.

Figure 6A:
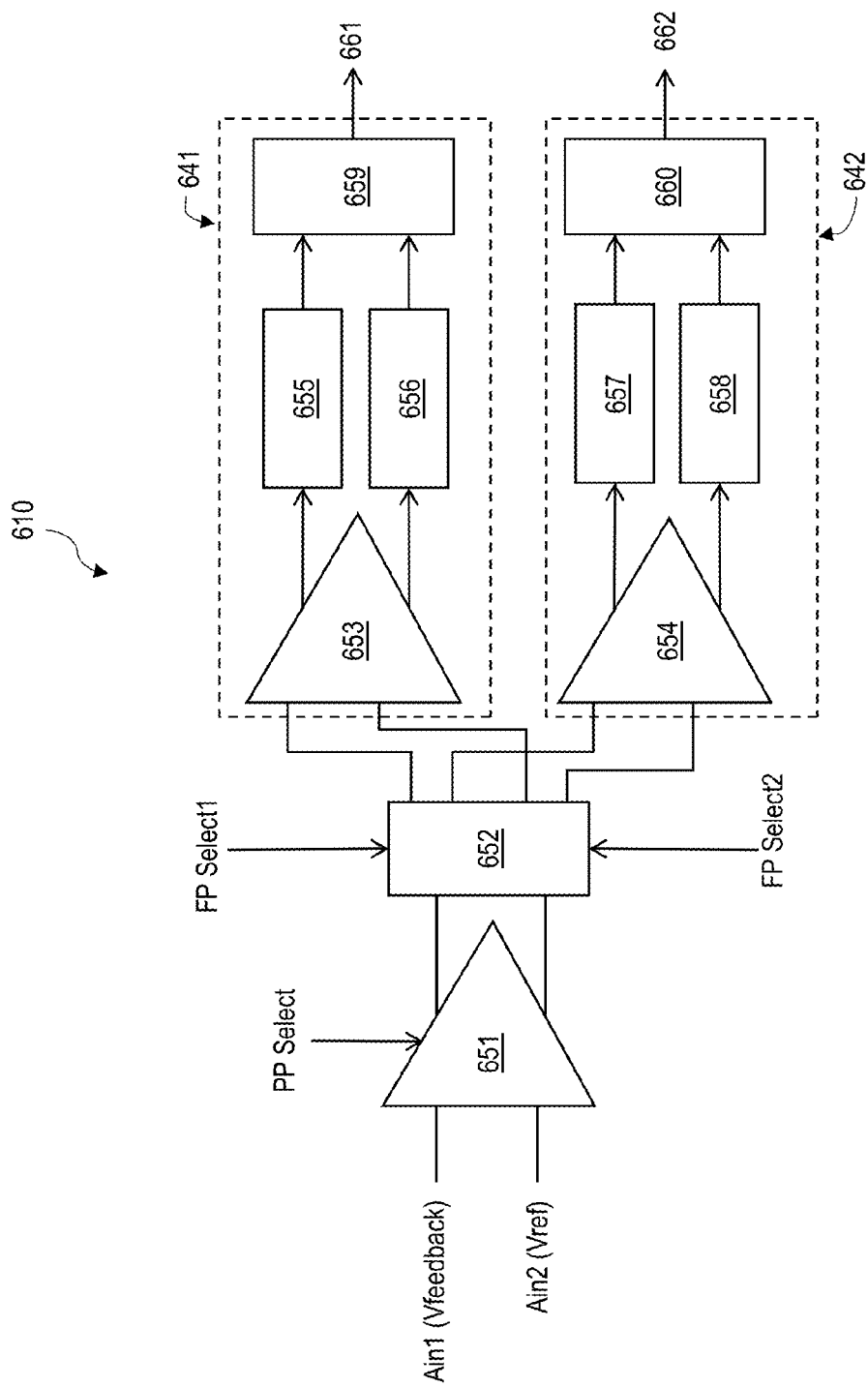
FIG. 6A shows an exemplary differential multiplicity architecture of an exemplary ADi block, according to one embodiment.

FIG. 6A shows an exemplary differential multiplicity architecture of an exemplary ADi block, according to one embodiment. The ADi block 610 has a front-end amplifier 651, a configuration block 652, and two differential analog-to-digital converters (ADCs) 641 and 642. The ADCs 641 and 642 can have the same structure including a back-end VCO, two counters, and an error generator. For example, the ADC 641 includes a back-end VCO 653, counters 655 and 656, and an error generator block 659, and the ADC 642 includes a back-end VCO 654, counters 657 and 658, and an error generator block 660. Although the present example shows only two ADCs 641 and 642, it is understood that the ADi block 610 can have any number of ADCs without deviating from the scope of the present disclosure.

The front-end amplifier 651 can receive two analog input signals Ain1 and Ain2. For example, the analog input signal Ain1 is a feedback voltage Vfeedback, and the analog input signal Ain2 is a reference voltage Vref. In this case, the ADi block 610 can be used to convert the difference of the analog voltage signals Vfeedback and Vref to a digital signal with a desired precision, fidelity, and sampling frequency. The digital output signal from the ADi block 610 can be digitally processed to generate a PWM signal to control a switch of a voltage regulator. The internal circuit components, signal wrappers, and the programmable fabric of the PLD can be configured to implement the voltage regulator as discussed above.

The front-end amplifier 651 amplifies the difference of the analog input signals Ain1 and Ain2 based on a user-adjustable configuration mode. The configuration mode of the ADi block 610 can be programmably adjusted using a primary precision configuration signal (PP Select) and fractional precision configuration signals (FP Select1 and FP Select 2) via the programmable fabric of the PLD. In one embodiment, the front-end amplifier can optimally operate the ADCs 641 and 642 by employing a common mode control. The common mode voltage level of the front-end amplifier 651 can be kept within a desired range for the operation of the ADCs 641 and 642. For example, the back-end VCOs can have a high-speed timing logic, turn-on, turn-off, value latching, etc. The differential signaling throughout the signal path can keep internal signals of the ADi block 610 immune to noise signals.

The differential signal amplified by the front-end amplifier 651 is sent to the configuration block 652, where the range and precision of a transfer function of the ADi block 610 is set. For example, the configuration block 652 can receive fractional configuration signals FP Select1 and FP Select2 from the programmable logic to properly configure the signal range and the fractional gain (less than 1) of the signal that is sent to the back-end VCOs 653 and 654. According to one embodiment, the output signals from the configuration block 652 can be fed to the back-end VCOs 653 and 653 as being time-multiplexed in a user-defined sequence. The primary configuration signal PP Select and the fractional configuration signals FP Select1 and FP Select2 can dynamically change (e.g., in the order of milliseconds sampling rate) the ratios of the resistors 681, 682, 683, and 684 to generate a sequence of output signals (as being time-multiplexed) with a dynamically varying precision and signal range. Each of the back-end VCOs 653 and 653 converts the received amplified differential signals with a different precision and signal range and generate oscillatory signals to the respective counters. For example, the back-end VCO 653 drives the counters 655 and 656, and the back-end VCO 654 drives the counters 657 and 658. Each of the counters 655 and 656 counts pulses of the received oscillatory signals, generates a counting signal, and sends the counting signal to an error generator block 659. Similarly, each of the counters 657 and 659 counts pulses of the received oscillatory signals, generates a counting signal, and send the counting signal to an error generator block 660. The error generator block 659 generates a digital output signal 661 (e.g., fine error) in accordance with a sampling mode and a signal range corresponding to the fractional precision FP Select 1 that is configured in the configuration block 652 whereas the error generator block 660 generates a digital output signal 662 (e.g., coarse error) in accordance with a sampling mode and a signal range corresponding to the fractional precision FP Select 2 that is configured in the configuration block 652.

The precision and the signal range of the ADi block 610 are expressed as functions of a primary precision (PP) gain, a fractional precision (FP) gain, and a conversion time (CT) and can be expressed as:

$$precision = f(PP, FP, CT), \text{ and}$$

$$range = g(PP, FP).$$

The precision may be proportional to the PP gain, FP gain, and the conversion time. The signal range may be inversely proportional to the PP gain and the FP gain.

According to one embodiment, the sampling mode of the ADi block 610 is configurable in either a fixed time (FxT) sampling mode or a fixed count (FxC) sampling mode. In the fixed time sampling mode, the back-end VCOs 653 and 654 operate for a user-programmable fixed period of time (e.g., 80 ns). The difference between the counting values of the dual racing oscillators in each of the ADCs 641 and 642 is captured at the end of the fixed time and used as a digital conversion code corresponding to the differential analog input signals Ain1 and Ain2 at the input ports of the ADi block 610. In the fixed count sampling mode, the back-end VCOs 653 and 654 operate up to a user-defined counting value (e.g. a count of 40). The difference between the counting values of the dual racing oscillators in each of the ADCs 641 and 642 is captured after the first oscillator reaches the fixed count value (i.e., 40) and used as a digital conversion code corresponding to the differential analog input signals Ain1 and Ain2 at the input ports of the ADi block 610. The ADi block 610 can include one or more back-end VCOs that can function as low-power analog-to-digital converters (ADCs). The ADi block 610 with the dynamic control of the primary precision and the fraction precision can be configured to have a user-configurable resolution range and a user-configurable resolution precision and utilize a time-multiplexed sampling with different resolutions at different sampling times. For example, when a signal range of the analog input signals goes beyond a predetermined range, the PP and/or FP gains can dynamically change to convert the analog input signals to a desired range. In another example, the sampling mode can change between the fixed time mode and the fixed count mode during the analog-to-digital conversion. The resolution range and the resolution precision as well as the frequency of the resolution sampling can be dynamically adjusted in real-time to obtain an optimized analog-to-digital conversion.

Figure 6B:
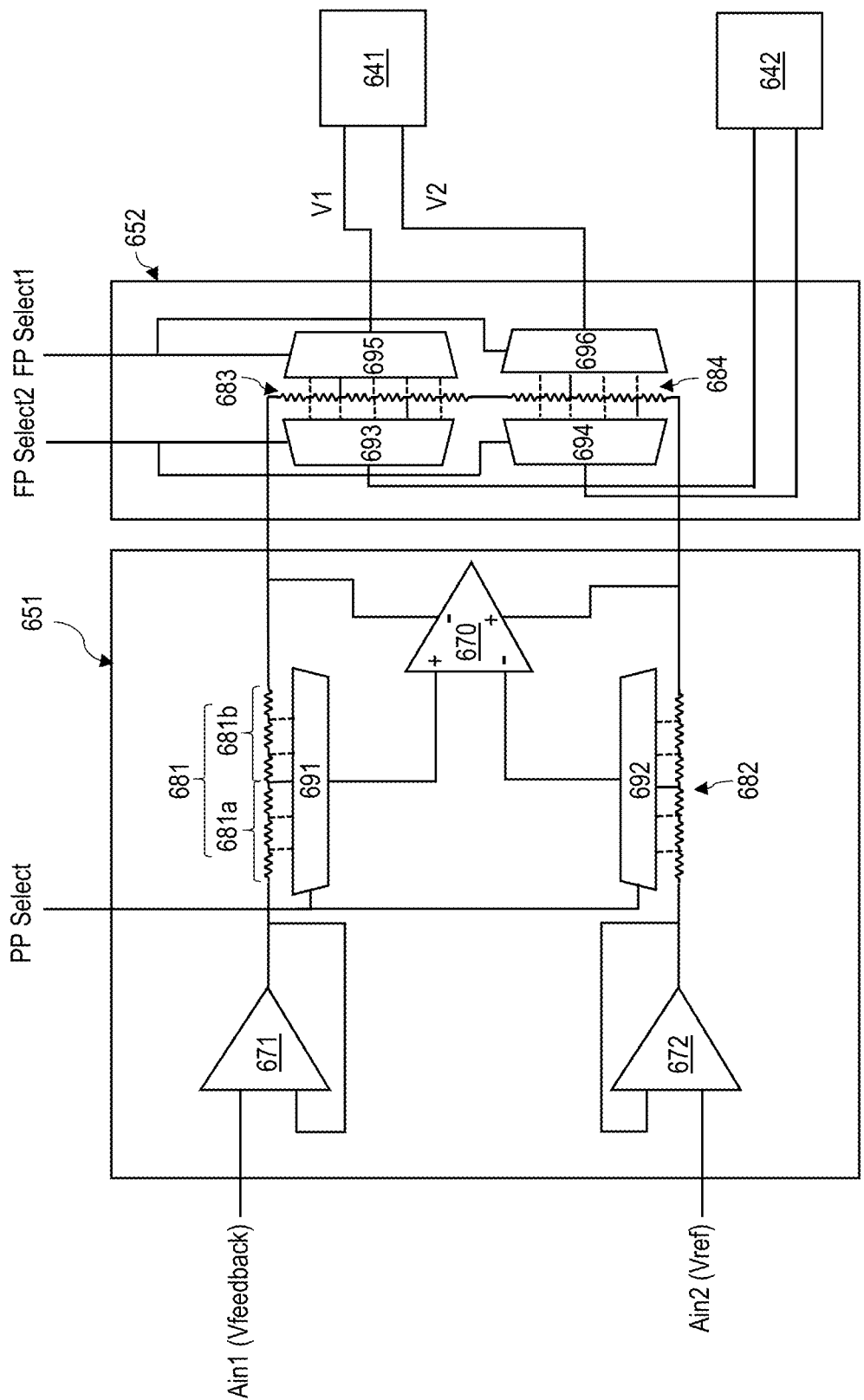
FIG. 6B shows an exemplary circuit diagram of the front-end amplifier and the configuration block of the ADi block shown in FIG. 6A, according to one embodiment.

FIG. 6B shows an exemplary circuit diagram of the front-end amplifier and the configuration block of the ADi block shown in FIG. 6A, according to one embodiment. The front-end amplifier 651 of the ADi block 610 includes two identical unity gain buffers 671 and 672 connected through a resistor stack including resistors 681, 682, 683, and 684. Each of the resistors 681, 682, 683, and 684 has a plurality of resistors connected in series and a plurality of tapping points to set a ratio of each resistor. For example, the multiplexer 691 sets the ratio of the partial resistors 681a and 681b of the resistor 681. The input ports of the front-end amplifier 651 are capable of receiving high impedance (highZ) or low impedance (lowZ) input signals. For example, a low-impedance input port can be driven by a low-impedance prior stage, and a high-impedance input port can provide a signal buffer to the analog input signal. In one embodiment, the front-end amplifier 651 can be programmably configured to directly connect the analog input signals Vfeedback and Vref to the resistors 681 and 682 without using the unity gain buffers 671 and 672. The programmable connectivity of the unity gain buffers 671 and 672 can depend on the impedance or driving capabilities of the analog input signals.

Figure 8:
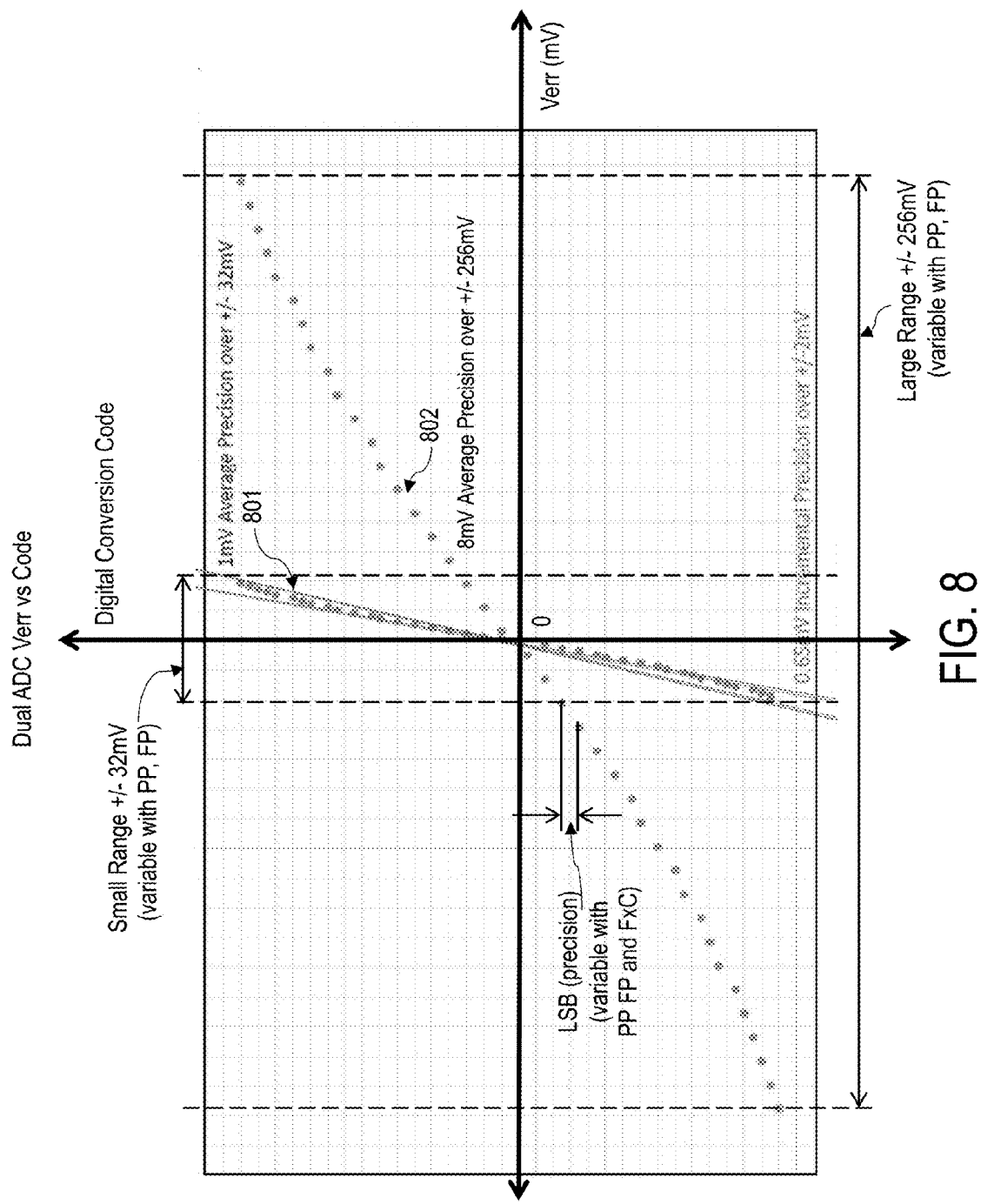
FIG. 8 illustrates a transfer function of an example dual precision ADC, according to one embodiment.

The primary precision configuration signal PP Select can select the resistance values of the resistors 681 and 682 using the multiplexers 691 and 692. For example, the multiplexer 691 connects to a tapping point among a plurality of predetermined tapping points using the PP Select signal and effectively changes the resistance value of the resistor 681, and the multiplexer 692 connects to a tapping point among a plurality of predetermined tapping points using the PP Select signal and effectively changes the resistance value of the resistor 682. Similarly, the fractional precision configuration signals FP Select1 and FP Select 2 can programmably connect a tapping point among the plurality of tapping points to effectively change the resistance values the resistors 683 and 684 using the multiplexers 693, 694, 695, and 696. For example, the differential input voltage is 1 mV, and the PP gain obtained by configuring the multiplexers 691 and 692 is 5×, resulting in the output from the amplifier 670 is 5 mV. The FP gain obtained by configuring the multiplexers 693, 694, 695, and 696 is (⅛)×, resulting in the differential output (V1-V2) out of the configuration block 652 is (⅝) mV. The PP gain and the FP gain that are set by adjusting the ratios of the resistors can map the range of the analog input signals onto a desired range of the signals fed to the dual ADCs 641 and 642. Ideally, the analog input signals can be mapped to a linear conversion range of the backend VCOs. In practice, the signal mapping can also use an "S-curved" range as shown in FIG. 8.

According to one embodiment, the performance of the analog-to-digital conversion by the ADi block 610 can be adjusted by trading off between the precision and the conversion time. In general, the higher the precision is, the slower the conversion time. Conversely, the faster the conversion time, the lower the precision. In some cases, the precision of the analog-to-digital conversion is more important, and the analog-to-digital conversion can have a longer conversion time. In other cases, a faster conversion time is required so that the precision of the analog-to-digital conversion may be sacrificed. A user can dynamically configure the ADi block 610 using various configuration parameters (e.g., PP Select, FP Select1, FP Select 2, a conversion time, a conversion count) via the programmable fabric to achieve the analog-to-digital conversion and the requirements of a user-specific application.

Figure 6C:
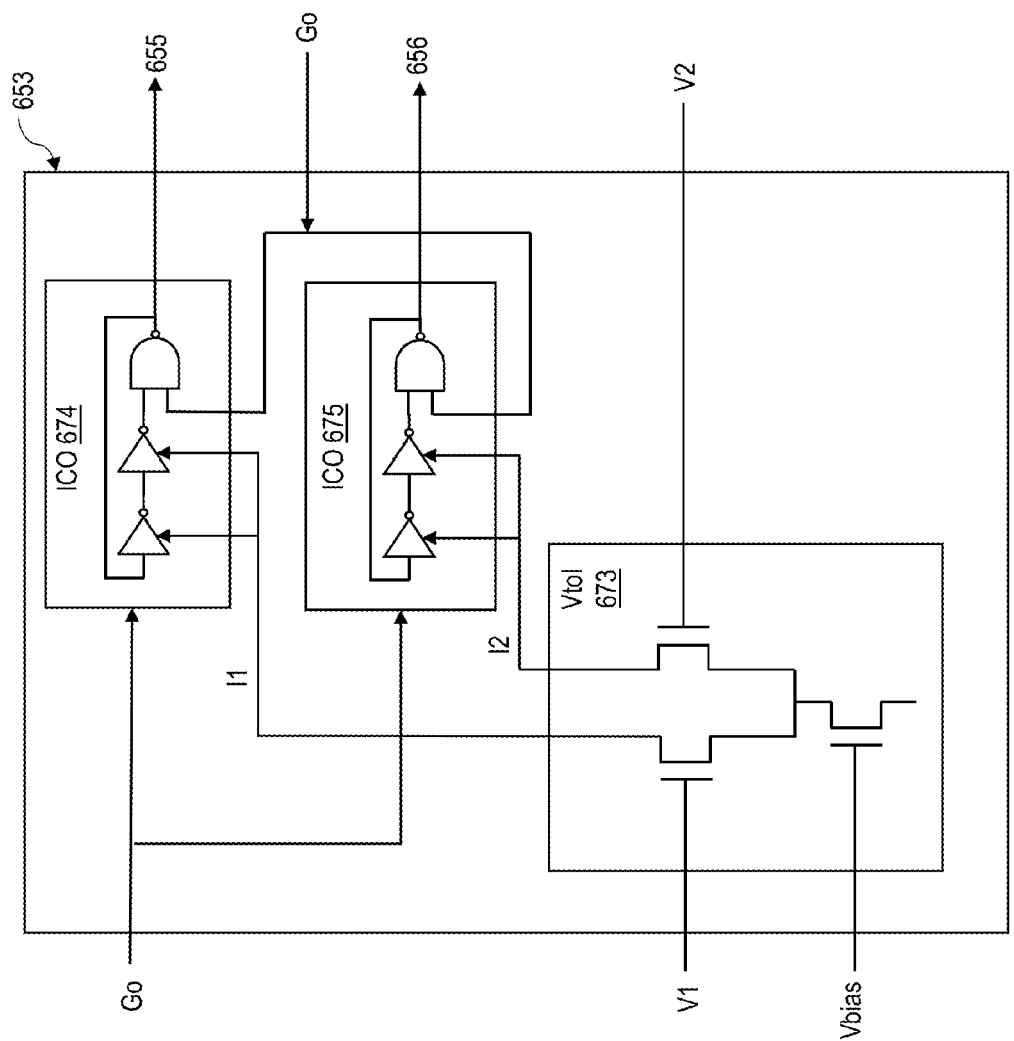
FIG. 6C shows a simplified circuit diagram of an exemplary VCO, according to one embodiment.

FIG. 6C shows a simplified circuit diagram of an exemplary VCO, according to one embodiment. The VCO 653 includes a voltage-to-current (VtoI) converter 673 and two current-controlled oscillators (ICOs) 674 and 675. The VCO 654 can have the identical structure as the VCO 653 except that the range of the voltage input signals V1 and V2 may vary. The VtoI converter 673 converts the voltage input signals V1 and V2 received from the configuration block 652 to current signals I1 and I2. The Vbias signal can be used to control the total current generated by the VtoI converter 673. The voltage level of the VtoI converter 673 can be a user-programmable variable that can control a bias-point operating frequency of the ICOs 674 and 675. In one embodiment, the ICOs 674 and 675 have the same structural components. For example, each ICO has two current-modulated NOT gates and a NAND gate connected in series, and the terminal ends of the NAND gate and the first NOT gate are connected. Based on the currents I1 and I2, the ICOs 674 and 675 independently starts to generate pulses after receiving the same Go signal from a timing controller (not shown). The timing controller can be a logic integrated in the ADi block 610, or the analog fabric of the programmable fabric can provide the Go signal. Using the Go signal, the ICOs 674 and 675 start to generate pulses having a frequency that varies based on the relative magnitude of the input currents I1 and I2, generating a racing condition. For example, the frequency of the pulses of the ICO gets faster as the current I1 is higher than the current I2 that is fed to the ICO 675. The higher the current I1 compared to the current I2, the faster the frequency of the pulses that ICO 674 generates. Similarly, the frequency of the pulses of the ICO 674 gets slower as the current I1 is lower than the current I2 fed to the ICO 675. When the current I1 and I2 are the same (or substantially the same), the pulses of the ICOs 674 and 675 have the same frequency that is determined by the analog circuit components of the ICOs 674 and 675. The output pulses by the ICOs 674 and 675 are counted by the counters 655 and 656. If the counting values by the counter 655 is higher than the counting value of the counter 656, the error generator blocks 659 generates a positive error code. If the counting values by the counter 655 is lower than the counting value of the counter 656, the error generator blocks 659 generates a negative error code.

The ADi block 610 has a symmetric architecture and processes positive and negative errors in the same manner except an error sign. The front-end differential amplifier 651 and the configuration block 652 steer the currents I1 and I2 in one direction or the other. The difference between the currents I1 and I2 can affect the relative oscillating frequencies of the dual racing oscillators 674 and 675. The error sign depends on which oscillator runs faster. For example, the error sign is positive if the frequency of the ICO 674 is faster than that of the ICO 675, and the error sign is negative if the frequency of the ICO 674 is slower than that of the ICO 675. The symmetry of the back-end VCOs 653 and 654 can be accomplished using matched differential pairs in the front-end amplifier 651 and the back-end VCOs 653 and 654. The differential pairs have symmetric current-voltage characteristics with either polarity of (IN+-IN−) or (IN−-IN+) for the chosen circuit components. The symmetric architecture can have good input common mode rejection that makes the differential signal conversion consistent over a wide range of analog input signals. In this regard, the VCOs 653 and 654 are matched to have a good symmetric behavior. Furthermore, the architecture of the ADi block 610 can couple a single front-end amplifier with its PP gain and FP configuration stage to multiple back-end VCOs to optimize the matching of signal paths between the different VCO digital outputs. This maximizes the integrity of the analog to digital conversion, forcing the multiple VCOs to sample the same analog signal. The symmetric architecture of the ADi block 610 has performance and efficiency advantages over conventional analog-to-digital conversion architectures that have separate processing for positive and negative errors.

Figure 6D:
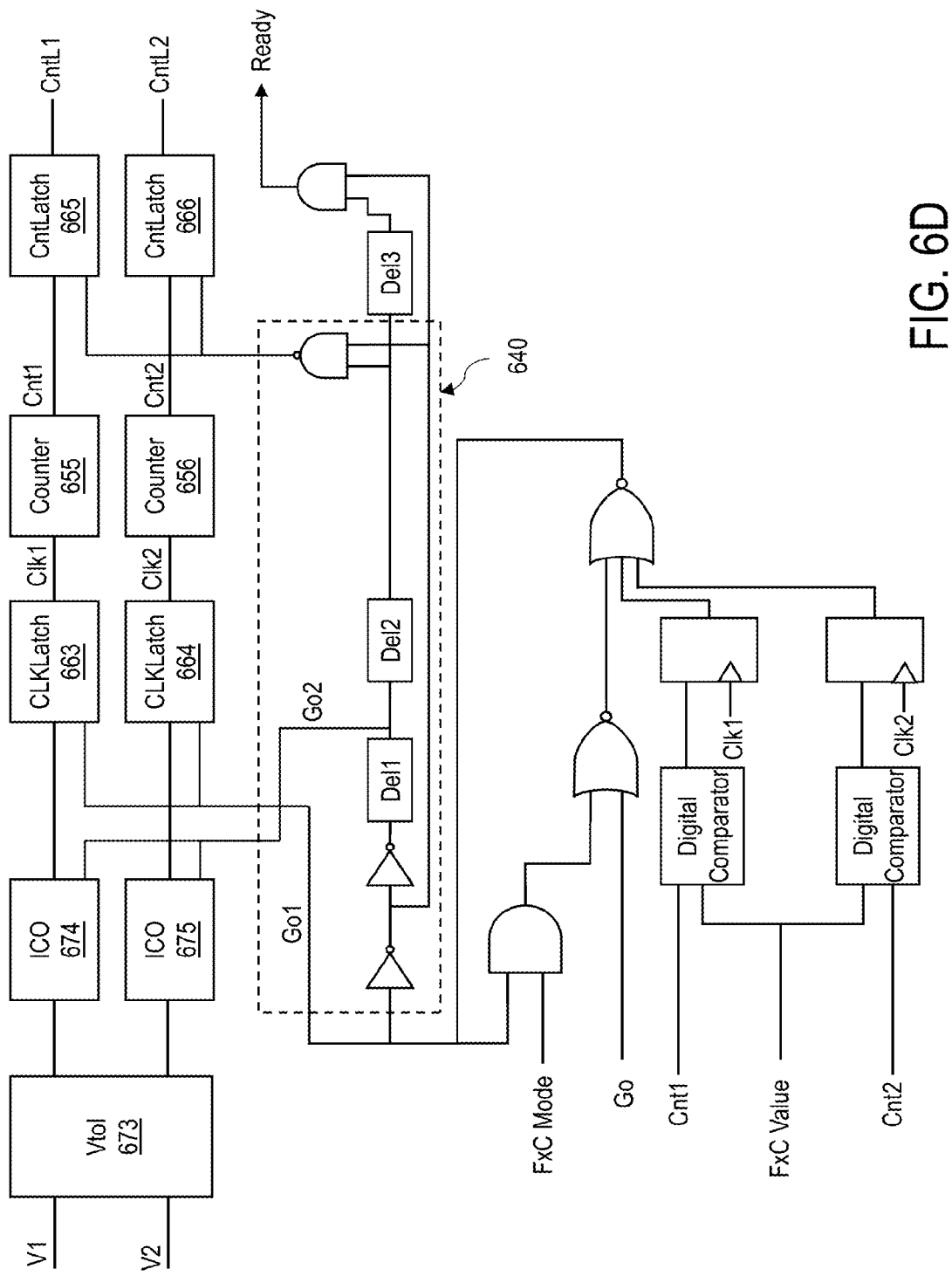
FIG. 6D shows an example timing controller of an example ADi block, according to one embodiment.

FIG. 6D shows an example timing controller of the ADi block, according to one embodiment. The FxC Mode signal determines the mode of the sampling. When the FxC Mode signal is high, the fixed count (FxC) mode is enabled, otherwise, the fixed time (FxT) mode is enabled. The Go signal generated by the timing controller triggers high to control the start of the ICOs 674 and 675 and makes the clock latch blocks 663 and 664 transparent to pass clock signals to the counters 655 and 656.

In the fixed time mode, the timing controller triggers the Go signal low (e.g., at a dropping edge) indicating the end of the sampling period. The Go1 signal having the same polarity as the Go signal triggers low to latch and stop the clocks in the clock latch blocks 663 and 664 and subsequently stop the oscillation of the ICOs 674 and 675 using the Go2 signal that is delayed by the delay block Del1 by a predetermined time delay. This sample timing of the clocks ensures the halting of the clocks Clk1 and Clk2 with the least timing uncertainty and variation, thereby ensuring high accuracy in the analog to digital conversion.

In the fixed count mode, the counter outputs Cnt1 and Cnt2 are compared against the FxC value to determine when the fixed count has been reached. When either of the counter outputs Cnt1 and Cnt2 reach the fixed count FxC value, the Go1 signal triggers low to latch and stop the clocks of the clock latch blocks 663 and 664, and the Go2 signal subsequently trigger low to stop the oscillation of the ICOs 674 and 675 with a time delay as defined by the delay block Del1 thereby indicating the end of sampling period. The clocks Clk1 and Clk2 are halted simultaneously with a precise timing to ensure the high accuracy of the analog to digital conversion.

According to one embodiment, the timing controller generates the fixed count value FxC value to configure the start and stop signals (i.e., Go1 and Go2 signals) for the ICOs 674 and 675 and the clock latch blocks 663 and 664. The clock latch blocks 663 and 664 generate the respective clock latched signals Clk1 and Clk2. The counter blocks 655 and 656 respectively receives the clock latched signals Clk1 and Clk2 to generate the counter signals Cnt1 and Cnt2. The counter signals Cnt1 and Cnt2 are latched by the counter latch blocks 665 and 666 to generate the latched digital counter codes CntL1 and CntL2. The counter latch blocks 665 and 666 are enabled to latch the counter signals when the counting sample operation is completed, thereby minimizing signal switching activity to reduce noise and power consumption.

Del1 and Del2 are delay blocks that delay an input signal and generate a delayed output signal with a programmable delay. Del3 is a delay block that includes a logic inversion. When the sampling has finished (i.e., fixed count or fixed time), the delay block Del11 provides a precise latching of the clock latching blocks 663 and 664 based on an earlier trigger of the Go1 signal and halts the clocks of the ICOs 674 and 675 before the stopping of the ICOs 674 and 675 using the Go2 signal that is delayed from the Go1 signal by a predetermined delay. The timing of the delay block Del1 contributes to improve the accuracy of the analog-to-digital conversion. The delay block Del2, in combination with the delay block Del1 and the Go signals Go1 and Go2 forms a pulse generator 640 that enables the counter latch blocks 665 and 666 to capture the conversion signal at the end of the sampling period. The operation of the counter latches and halting the clocks to stop the ICOs after the counter latch can save power consumption during the sampling time of the conversion operation. The negative edge of the Go1 signal can trigger the pulse, and the combined delay of the delay blocks Del1 and Del2 determines a timing window for the counter latch blocks 665 and 666 to capture the count values. The delay block Del3 can provide a timing margin for the Ready signal.

Using the Go signals and the counter signals Cnt1 and Cnt2, the timing controller can generate the Ready signal to indicate the latched digital counter codes CntL1 and CntL2 that correspond to the error of the input analog signals Vfeedback and Vref are ready to be read when the conversion data is correctly latched into the count latch blocks 665 and 666. When the Ready signal is low, the digital codes that are output from the counter latch blocks 665 and 666 are considered to be invalid.

Referring to FIG. 6C and 6D, each of the back-end VCOs 653 and 654 of the ADi block 610 includes a current-starved oscillator with a NAND output stage for identical race timing (critical race timing and race finish methodology for accuracy and monotonicity). A race occurs between the two ICOs in the back-end VCOs 653 and 654 that are connected to the differential pair. The current bias through the first ICO or the second ICO determines the speed at which the ICOs oscillate.

Based on the user's configuration for the sampling mode, the ADi block 610 can provide the analog-to-digital conversion in a fixed time (FxT) mode or a fixed count (FxC) mode. In the fixed count mode, the racing between the ICOs starts at a Go signal (e.g., a rising edge of the Go Signal) and continues to a particular count value (i.e., FxC value) at which point the count values reached in both counters are latched to determine a digital error code. The timing controller can provide fast and precise starting and finishing signals of the race to provide an accurate and noise-immune conversion performance.

For example, the back-end VCOs 653 and 654 employ a mixed approach analog matching layout for simultaneous device matching while shielding an oscillation noise between racing oscillators. In one embodiment, the back-end VCOs 653 and 654 can be configured to run in a fixed count (FxC) mode using a high-speed race finish logic that can shut-off the VCO and latch the count with an accuracy to fine time the race finishes (i.e., fine timing needed for accuracy). In another embodiment, the back-end VCOs 653 and 654 can be configured in a fixed time (FxT) mode. In yet another embodiment, the back-end VCOs 653 and 654 can be configured in a half cycle count mode to improve the conversion speed while obtaining a higher resolution at a shorter sampling time. The half cycle counting operation is available in both FxT and FxC modes. The half cycle counting operation is implemented in the counters and can be used for both time sampling modes. The back-end VCOs 653 and 654 have a high-speed conversion latency. The back-end VCOs 653 and 654 can be non-linear but mirrored with a high-precision near an error point. The symmetric architecture of the back-end VCOs 653 and 654 is especially effective for catching a voltage error in a regulator application of the PLD. Non-linear error can be back-compensated out if necessary. These features of the back-end VCOs 653 and 654 can achieve a high precision in a cost-effective manner where regulation applications need the most.

According to one embodiment, the present ADi block can provide a dynamic offset calibration for compensating a device mismatch, variations of the analog circuit components or the operating conditions (e.g., temperature compensation), herein also referred to as process, voltage, and temperature (PVT) compensation. For example, the PVT compensation can be applied fine-tuning the precision setting of the resistors in the front-end amplifier and the configuration block.

The dynamic calibration can be performed in real time using a calibration signal available in the programmable fabric by capturing an offset error for a known pair of differential analog inputs in a digital code. After the calibration is performed, the amount of offset detected by the digital code may be compensated when generating digital codes using the actual analog input signal.

According to one embodiment, the error calibration can be performed in the following steps:

1. The same analog input signals are provided to the reference voltage Vref and the feedback voltage Vfeedback through a switch that connects the input of the unity gain buffers 671 and 672. This puts a "zero" error signal to the inputs of the ADi block 610.
2. The digital conversion code that is held in either or both error generator blocks 659 and 660 contains the output digital code that corresponds to a "zero" error signal. This digital conversion code is "0" for a perfectly calibrated system, but may contain an error value when there is a device mismatch or variations in the signal path or the operating condition.
3. The digital error code in the error generator blocks 659 and 660 is latched.
4. The error generator blocks 659 and 660 subtract the latched value obtained from the step (3) from the subsequent digital codes generated with actual analog input signals. The error calibration can dynamically calibrate the device mismatch, aging, errors and/or operating condition using minimal resources of the ADi block 610.

Recalibration can be done by repeating the steps of the error calibration procedure described above any number of times. The full offset calibration can be applied by capturing the net offsetting effect of all components in the signal path of the ADi block 610. The full offset calibration can include aspects of other offsets that may be sensitive to the operating point of the intermediary circuit components of the ADi block 610.

FIG. 7A shows a simplified block diagram of an example ADi block for preforming a block-level signal calibration, according to one embodiment. The ADi block 710 includes a calibration switch SW1, a conversion core (e.g., a front-end amplifier, a configuration block, VCOs, counters) and an error generator 759. A calibration signal received from the programmable fabric starts a block-level calibration procedure by coupling the signal paths for the analog input signals Ain1 and Ain2. This provides the identical analog input signals to the ADi block 710. For example, the input signal may be generated by another adaptive block integrated in the PLD or may be externally provided. In either case, the calibration switch SW1 is closed to send the identical analog inputs to the ADi block 710. The calibration signal is also fed to the error generator block 759, where a digital conversion code corresponding to the digital output signal Dout is recorded. For a device mismatch or variations in the signal path within the ADi block 710, the digital output signal Dout may not be zero although the difference of the analog input signals Ain1 and Ain2 is zero. The calibration value can be stored in a calibration register of the error generator block 759 as a calibration value. This is also referred to as an offset calibration. The offset calibration accounts for the device mismatch and/or variations of the circuit components when identical two analog input signals are input to the ADi block 710.

According to one embodiment, two reference analog input signals that are different from each other can be used for the block-level calibration. In this case, the two reference input signals Ain1 and Ain2 may be internally generated by one or more Nref blocks integrated in the PLD or externally provided via the I/O blocks of the PLD. This is also referred to as a transfer-function calibration using known analog input signals. The transfer-function calibration can compensate errors caused by the device circuitry including the gain amplifier for a known amplifier gain. For example, one or more reference digital conversion codes corresponding to two known analog input signals are stored. The actual digital conversion codes that are obtained by inputting the two analog input signals are compared against the reference digital conversion codes. The reference digital conversion codes may include a list of conversion codes corresponding to a plurality of input signals and gain values. The transfer-function calibration can be performed within the ADi block using dedicated calibration circuitry or by externally providing analog input signals corresponding to the stored reference analog input signals and gain values.

FIG. 7B shows a simplified block diagram of an example error generator for providing a block-level signal calibration, according to one embodiment. After the calibration value is obtained, the actual analog input signals are received and converted by the ADi block 710. The error generator block 759 compensates the digital output signal Dout by subtracting the calibration value to generate the calibration digital output signal Dout_Calibrated. The block-level signal calibration can be programmably performed when the PLD is powered up or in real-time between sampling periods. The calibration values are stored in a table, and the error generator block 759 may report to the signal wrapper of the ADi block 710 and hence other adaptive blocks of the PLD coupled to the ADi block 710 to indicate a warning when the calibration value becomes larger than a threshold. The generator block 759 may store a list of calibration values along with an operating condition or parameters (e.g., temperature from a thermal sensor coupled to the PLD) and apply the block-level signal calibration based on the record of the lookup table independently from or with reference to a real-time signal calibration.

The calibration procedure may be extended beyond the ADi block 710 to include calibration of offsets from an external component or a system (e.g., a sensor circuitry of a system) in which the ADi block 710 is included. The system can be a mixed signal PLD where the analog routing, analog sensors, or other modules of the PLD may have accuracy errors. In this manner, the cumulative analog errors within an arbitrary PLD system can be calibrated in a digital domain. For example, an instrumentation amplifier (InAmp) used upstream in a signal chain to the ADi can have reconfigurable inputs that force a "0" signal at the inputs of the InAmp. The calibration protocol can be used to capture the offset error of the entire signal path, including ADi or non-ADi components. This system-level calibration value can be used in the same manner as described above for calibrating the device-level offset errors. The stored digital calibration value can also be utilized in other aspects of the system data processing, including but not limited to, digital reference correction or telemetry applications.

FIG. 7C shows a simplified block diagram for providing a system-level signal calibration, according to one embodiment. The calibration signal received from the programmable fabric starts a system-level calibration procedure by coupling the signal paths for the analog input signals A1 and A2. This provides the identical analog input signals to the system 751. The system 751 may include one or more system components that may affect the signal integrity of the analog input signals A1 and A2 and generates analog input signals Ain1 and Ain2 to the ADi block 710. Compared to the block-level signal calibration as shown in FIG. 7A, the system-level signal calibration can compensate for the device mismatch, the signal noise external to the ADi block 710, as well as the ADi block-level signal variation at a system level. The system-level calibration value is recorded by the error generator block 759 and applied to the actual input signals A1 and A2 in real-time in a similar manner discussed above with reference to the block-level signal compensation. Although the present example shows that the calibration switch SW2 is used to equate the analog input signals A1 and A2, it is noted that two different reference input signals A1 and A2 can be used to perform the system-level signal calibration to compensate for the transfer function. Those reference input signals A1 and A2 may be internally generated by one or more Nref blocks integrated in the PLD or externally provided via the I/O blocks of the PLD.

FIG. 8 illustrates a transfer function of an example dual precision ADC, according to one embodiment. The dual precision ADC employed by the present ADi block converts the input differential analog voltage input signals (i.e., error voltage signal Verr) to the output digital code value using one or more transfer functions. For example, the dual precision ADC include a high precision ADC with a steep digital code per mV and a low precision ADC with a shallow digital code per mV. The input to the ADi block is a voltage error Verr represented by the x-axis, and the y-axis is a digital conversion code. The data points 801 represent a small range ADC with 0.65 mV incremental precision over a narrower range of +/− 2 mV voltage error inputs near the origin, and 1 mV average precision over a wider range of +/− 32 mV voltage error inputs. In general, the incremental precision becomes larger as the voltage error inputs deviate from the origin. The data points 802 represent a large range ADC with 8 mV average precision over +/− 256 mV range of the voltage error inputs. The ADi block can include both a high precision ADC and the low precision ADC for converting the voltage error in a fine scale and a coarse scale. In some embodiments, the ADi block can include only one ADC that can generate time-multiplexed digital outputs for more than one transfer functions. The precision settings for the dual precision ADC can be set using a predetermined set of values (e.g., 1 mV, 4 mV, 1.257 mV, 27.55 mV).

In the present example, the digital conversion code can correspond to a difference between the counter values of the two oscillators included in the dual precision ADC (e.g., differential ADCs 641 and 642 shown in FIG. 6A). The digital conversion code generated by the ADi block can have a high precision and a lower precision by adjusting the primary precision PP and fractional precision FP. The least significant bit (LSB), or the minimal precision fidelity, of the digital code can be adjusted by adjusting the PP, FP and the fixed count value (FxC). In FIG. 8, the same input signal (x-axis) is given to a dual configuration ADC, and the output code from one VCOADC has a high precision but a short range 801, and the other VCOADC has a low precision and a high range 802. In one embodiment, the same ADi architecture can be used to provide multiple transfer functions using different set of PP, FP, and FxC. In some embodiments, the ADi block can be configured to have more than two transfer functions, and a specific transfer function can be used in different operating conditions or per user's configuration. It is noted that the front-end amplifier of the ADi block is shared for the differential signal pair of the differential ADC so the signal matching between ADC output signals is highly maintained during the signal conversion.

Figure 9:
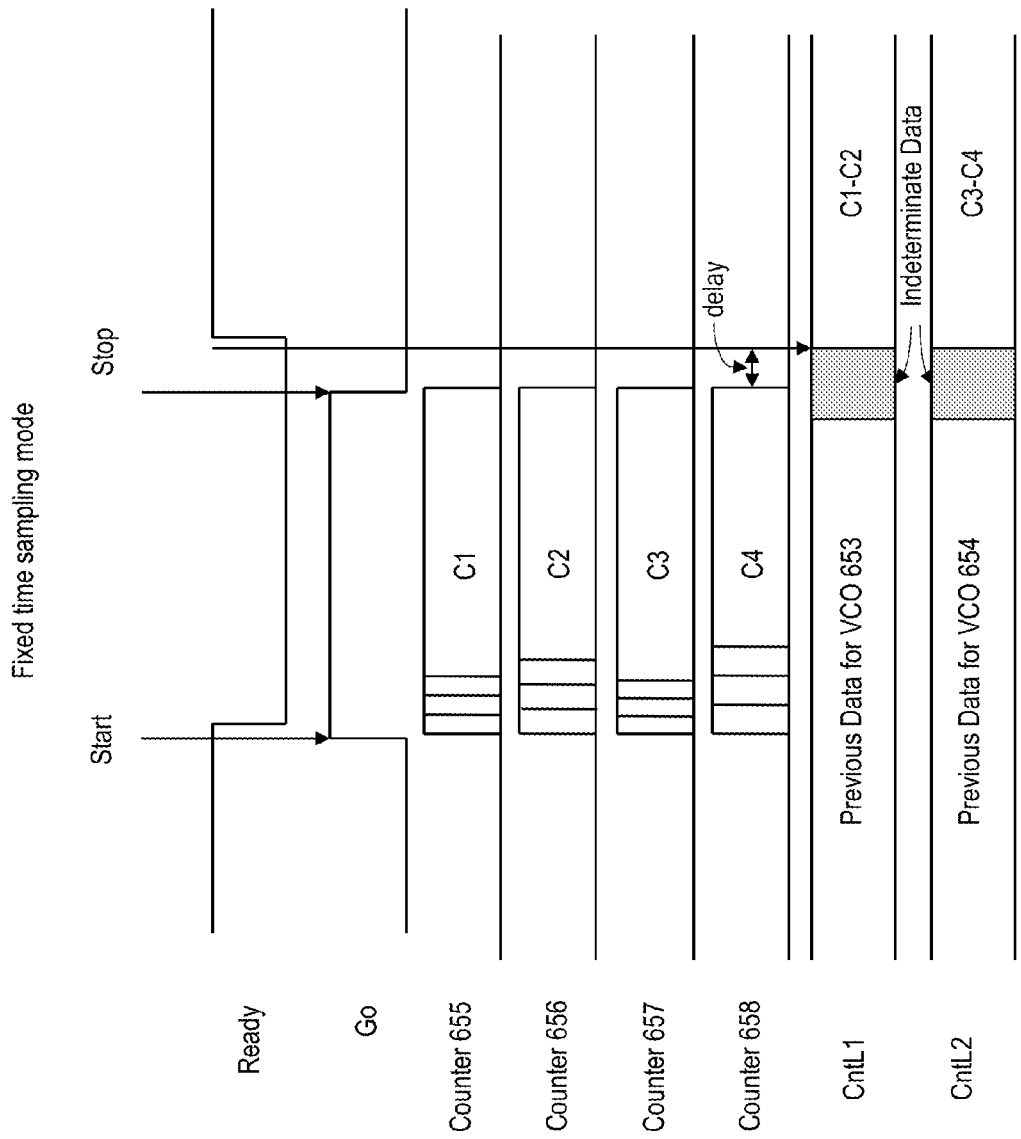
FIG. 9 shows an example of a fixed time mode operation, according to one embodiment.

FIG. 9 shows an example of a fixed time mode operation, according to one embodiment. The rising edge of the Go signal starts a racing between two oscillators in the VCOs. When the Go signal goes low, the race is complete, and the counter values C1 and C2 of the counters 655 and 656 and the counter values C3 and C4 of the counters 657 and 658 are captured. The signal CntL1 corresponding to the difference of the counter values, C1-C2, is output to the counter latch 665, and the signal CntL2 corresponding to the difference of the counter values, C3-C4, is output to the counter latch 666. The data output to the counter latches 665 and 666 may be valid after a programmable delay. The programmable delay allows the transient state of the oscillators to settle down after the signals CntL1 and CntL2 are output. Shortly after the latched signals CntL1 and CntL2 are output as determined by another programmable delay, the ready signal switches from low to high indicating that the latched signals CntL1 and CntL2 are ready to be read. The transfer functions in the FxC and FxT modes are similar to each other except the issuance of the stop signal. The FxC mode shows a better linear conversion region and more immunity to the circuit process (P), voltage (V), and temperature (T) variations. The FxT mode allows the precise sampling for a time interval defined by the Go signal.

Figure 10:
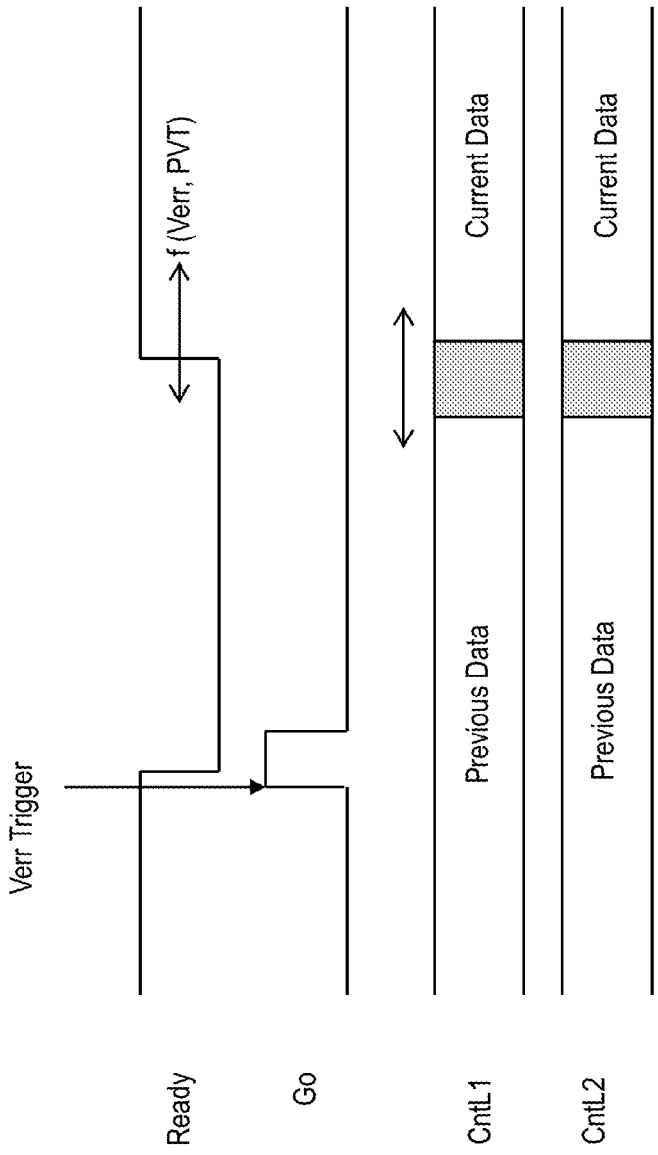
FIG. 10 shows an example of a fixed count mode operation, according to one embodiment.

FIG. 10 shows an example of a fixed count mode operation, according to one embodiment. The transfer function f of the fixed count mode is a function of a transistor manufacturing process (P), a supply voltage (V), an operating temperature (T), and a fixed count (FxC):

$$\text{Digital Code} = f(\text{Vern}, P, V, T, FxC).$$

The positive edge of the Go signal can trigger the start of the racing oscillators. When the timing controller detects that the first oscillator reached a predefined count, the counts of both oscillators are recorded, and their difference is latched and output as a digital output code. The conversion parameters including the sampling mode as well as the primary precision (PP) and the fractional precision (FP) can dynamically change.

Figure 11:
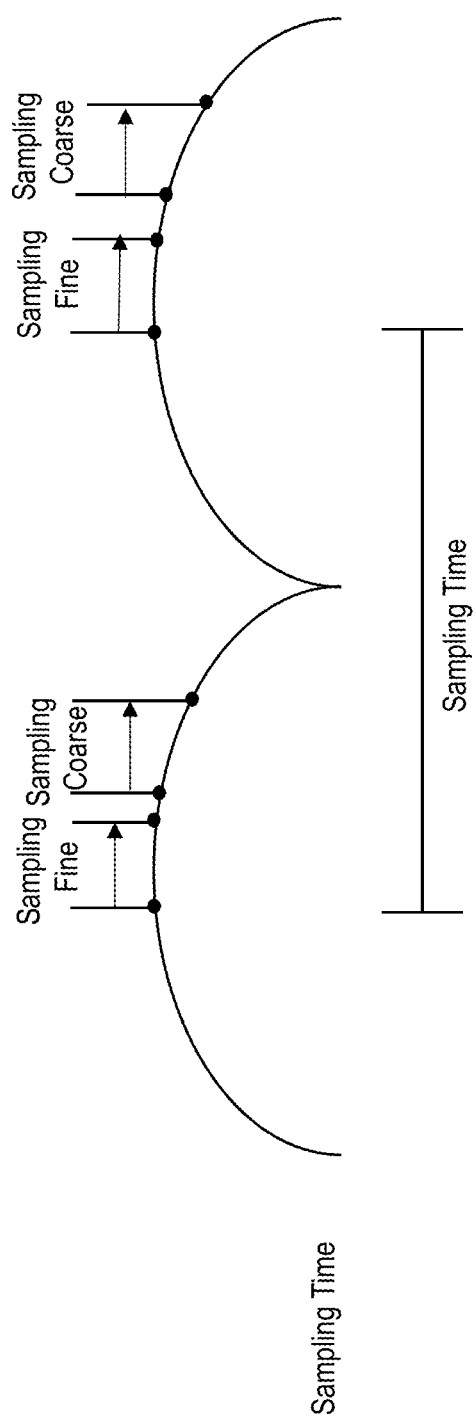
FIG. 11 shows an example of a time-multiplexed ADC precision, according to one embodiment.

FIG. 11 shows an example of a time-multiplexed ADC precision, according to one embodiment. The fractional precision parameter can be changed in real time through the digital fabric of the programmable fabric. This enables reuse of the same VCO over two sampling intervals. The same VCO can have different transfer functions at different sampling intervals by dynamically changing the precision parameters PP and FP and/or the sampling mode. For example, we can convert the analog input signals by using different precision settings for an internal 1, interval 2, and interval 3, and so on to generate digital codes in a time multiplexed sequence. The time-multiplexed ADC conversion can capture input signals with different precision settings and sampling modes.

According to one embodiment, the ADi block can have only one differential ADC instead of having two or more ADCs, for example, the differential ADCs 641 and 642 shown in FIG. 6A. The single differential ADC (e.g., ADC 641 of FIG. 6A) can provide digital output signals for more than one precision settings (e.g., a fine precision and a coarse precision) by time-multiplexing the digital output signals for the more than one precision settings. The ADi block including a single differential ADC can utilize less circuit components saving the silicon area. It is understood that any number of ADCs can be included in the ADi block to provide time-multiplexed digital output signals or a dedicated digital output signal for each ADC.

Figure 12:
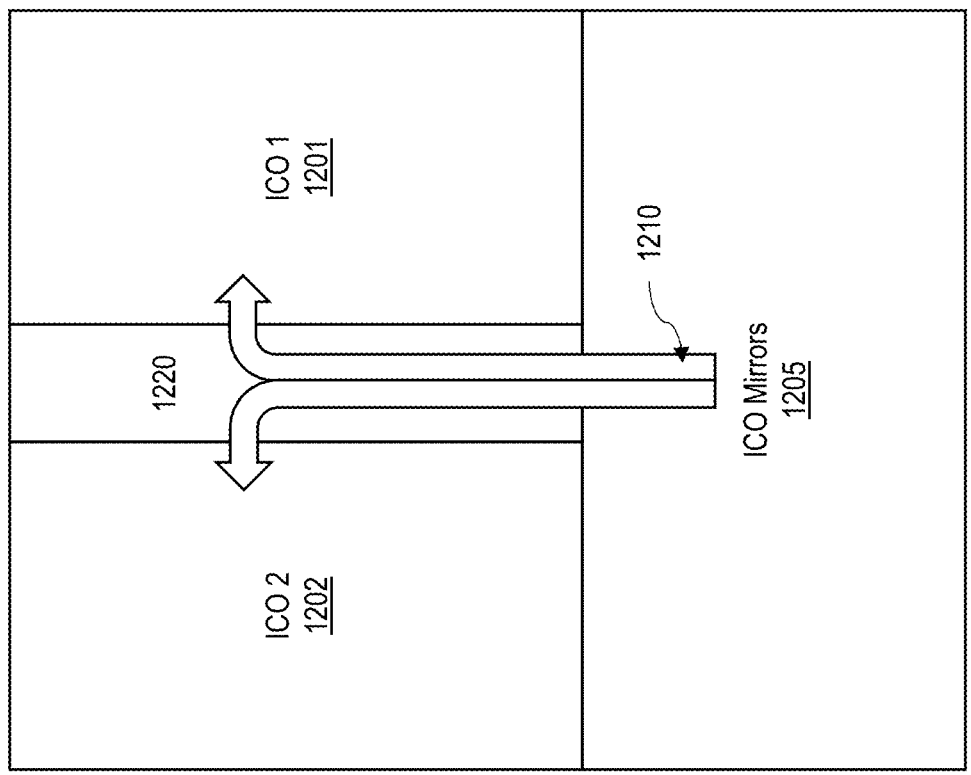
FIG. 12 shows a layout of dual oscillators included in an example ADi block, according to one embodiment.

FIG. 12 shows an example layout of ICOs and an ICO mirror, according to one embodiment. The two ICO blocks 1201 and 1202 corresponding to the ICOs 674 and 675 shown in FIGS. 6C and 6D are arranged to be separated from each other by a separation area 1220. ICO mirror circuits 1205 are arranged at one side of the two ICOs 674 and 675, and the two ICO blocks 1201 and 1202 are arranged to have a substantially similar distance from the ICO mirror circuits 1205. The ICO mirror circuits 1205 include transistor legs 1210 that feed current inputs to the internal analog transistors included in the two ICO blocks 1201 and 1202 through the separation area 1220. The layout of the two ICOs 674 and 675 and the ICO mirror circuits 1205 can balance and match the desired tight precision settings using equal current inputs through the transistor legs 1210 while isolating ICOs to prevent unwanted cross-talk noise between the two ICOs. The ICO mirror circuits 1205 are kept in close proximity with geometric matching to minimize transistor variations from manufacturing or temperature gradients on the silicon. The switching portion of the ICOs 1201 and 1202 are kept in close proximity but with a physical separation to prevent a crosstalk therebetween. The biasing voltage nodes of the ICOs 1201 and 1202 (e.g., the input port for the Vbias signal shown in FIG. 6C) can be further stabilized by connecting capacitors to the power rails (not shown).

Figure 13:
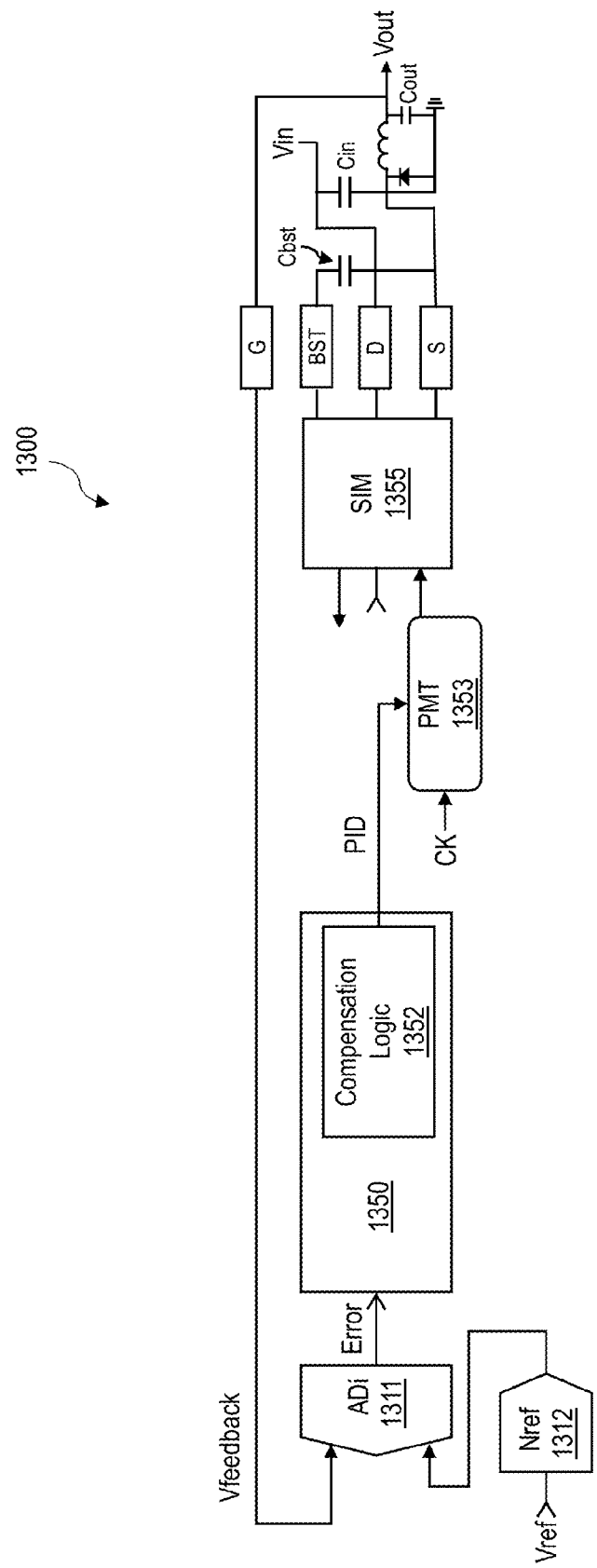
FIG. 13 shows a simplified circuit diagram of a voltage-mode regulator, according to one embodiment.

FIG. 13 shows a simplified circuit diagram of a voltage-mode regulator, according to one embodiment. The present example shows an asynchronous buck regulator 1100. The asynchronous buck regulator 1100 includes an adaptive error digitizer block 1111 (herein also referred to as an ADi block), a voltage reference block 1112 (herein also referred to as an Nref block), a compensation memory block 1150, a precision modulation timer (PMT) block 1153, and a high voltage power transistor block 1155 (herein also referred to as a SIM block). The feedback voltage Vfeedback is compared against a reference voltage Vref supplied by the Nref block 1112 of the PLD using the ADi block 1111. The ADi block 1111 produces a digital error that is fed to the compensation memory 1150 including an integrated compensation logic 1152. The calculated PID value (a sum of the three products E[n]*a, E[n−1]*b, and E[n−2]*c) controls the PMT 1153 by setting the PWM pulse width of a duty cycle. The PMT 1153 controls the switch of the SIM block 1155, turning it on or off as required to maintain the output voltage Vout at a constant voltage level.

The Nref block 1112 is configured and programmed with the reference voltage Vref and is used to specify the output voltage Vout, a soft-start, and a soft-stop. The output signal from the Nref block 1112, i.e., the reference voltage Vref, is compared with the feedback voltage Vfeedback in the ADi block 1111 to provide the error signal to the compensation logic 1152. Soft-start ramps the output voltage Vout by dynamically loading the Nref block 1112 with a specified digital ramp function to control the rate of the output voltage Vout increasing from zero to the reference voltage Vref. Similarly, soft-stop ramps the output voltage Vout by dynamically loading the Nref block 1112 with a specified digital ramp function to control the rate of the output voltage Vout decreasing from the reference voltage Vref to zero.

Referring to FIG. 3A, the voltage reference 307 is configured and programmed with the reference voltage Vref that is compared with the feedback voltage Vfeedback 305 to provide an error signal to turn off the transistor 303 when the output voltage Vout is above the reference voltage Vref.

An analog-to-digital conversion block includes: an amplifier block configured to receive two analog input signals and a primary-precision configuration signal and generate a first pair of differential signals by amplifying the two analog input signals according to a primary-precision gain that is programmably set by the primary-precision configuration signal; a configuration block configured to receive a fractional-precision configuration signal and generate a second pair of differential signals by amplifying the first pair of differential signals according to a fractional-precision gain that is programmably set by the fractional-precision configuration signal; and a differential analog-to-digital converter (ADC) including a voltage-controlled oscillator (VCO), two counters, and an error generator block. The VCO receives the second pair of differential signals and generates two pulse signals having frequencies that vary depending on a difference between the second pair of differential signals. Each of the two counters receives a respective pulse signal from the VCO and generate a digital counter value. The error generator block receives digital counter values from the two digital counters generates a digital conversion code corresponding to a difference between the digital counter values.

The primary-precision configuration signal and the plurality of fractional-precision configuration signals may be received from a programmable fabric of a programmable logic device (PLD).

The differential ADC may further include a first ADC including a first VCO and a second ADC including a second VCO. The first VCO and the second VCO may have different precision settings for converting the two analog input signals based on the primary-precision configuration signal and a plurality of fractional-precision configuration signals.

The amplifier block may include one or more resistors and one or more multiplexers corresponding to the one or more resistors. Each of the one or more multiplexers may be configured to programmably adjust a ratio of a corresponding resistor by connecting to a tapping point among a predetermined set of tapping points based on the primary-precision configuration signal, and each tapping point of the predetermined set of tapping points may provide a different ratio of the corresponding resistor.

The amplifier block may further include an amplifier that generates the first pair of differential signals based on ratios of the one or more resistors.

The configuration block may further include two resistors and four multiplexers, and each of the four multiplexer is configured to programmably adjust a ratio of a corresponding resistor by connecting to a tapping point among a predetermined set of tapping points based on the fractional-precision configuration signal, and each tapping point of the predetermined set of tapping points may provide a different ratio of the corresponding resistor.

The VCO included in the differential ADC may include: a voltage-to-current converter and two current-controlled oscillators (ICOs).

The two ICOs may be arranged from a substantially equal distance from ICO mirror circuits and may receive current inputs from the ICO mirror circuits through transistor legs, and the two ICOs may be separated from each other by a separation area, and the transistor legs feeding the current inputs from the ICO mirror circuits may be positioned in the separation area.

The differential ADC may further include: two clock latch blocks and two counter latch blocks.

The ADC block may further include a calibration switch and a calibration register. The calibration switch may be closed in response to a calibration signal to provide two reference analog signals to the ADC block, and the error generator block may be configured to store an offset digital conversion code corresponding to the two reference analog signals in the calibration register.

The error generator block may be configured to subtract the offset digital conversion code to generate a calibrated digital conversion code corresponding to the two analog input signals.

A method includes: receiving two analog input signals, a primary-precision configuration signal, and a fractional-precision configuration signal; generating a first pair of differential signals by amplifying the two analog input signals according to a primary-precision gain that is programmably set by the primary-precision configuration signal; generating a second pair of differential signals by amplifying the first pair of differential signals according to a fractional-precision gain that is programmably set by the fractional-precision configuration signal; and converting the second pair of differential signals to a digital conversion code corresponding to a difference between the two analog input signals using a differential analog-to-digital converter (ADC). The differential ADC includes a voltage-controlled oscillator (VCO), two counters, and an error generator block. The VCO included in the ADC receives the second pair of differential signals and generates two pulse signals having frequencies that vary depending on a difference between the second pair of differential signals. Each of the two counters receives a respective pulse signal of the two pulse signals from the VCO and generates a digital counter value. The error generator block receives digital counter values from the two counters and generates a digital conversion code corresponding to a difference between the two digital counter values.

The primary-precision configuration signal and the plurality of fractional-precision configuration signals may be received from a programmable fabric of a programmable logic device (PLD).

The differential ADC may further include a first ADC including a first VCO and a second ADC including a second VCO, and the method may further include: setting different precision setting for the first VCO and the second VCO based on the primary-precision configuration signal and a plurality of fractional-precision configuration signals.

The method may further include: programmably adjusting a ratio of a resistor by connecting to a tapping point among a predetermined set of tapping points based on the primary-precision configuration signal. Each tapping point of the predetermined set of tapping points may provide a different ratio of the corresponding resistor.

The VCO may further include: a voltage-to-current converter, two current-controlled oscillators (ICOs), and the differential ADC may further two clock latch blocks connected between the two ICOs and the two counters. The method may further include: latching the two clock latch blocks at an expiry of a sampling period and halting clocks of the two ICOs after a first delay from the latching of the two clock latch blocks.

The differential ADC may further include two counter latch blocks between the two counters and the error generator block. The method may further include: generating a pulse signal to the two counter latch blocks to capture the digital counter values after a second delay from the first delay.

The method may further include: receiving a programable count value; comparing the digital counter values against the programmable count value; and generating a latching signal to latch the two clock latch blocks when one of the digital counter values reaches the programmable count value indicating the expiry of the sampling period.

The method may further include: receiving a programable time value; and generating a latching signal to latch the two clock latch blocks when the sampling period reaches over the programmable time value indicating the expiry of the sampling period.

The method may further include: generating a ready signal indicating that the digital counter values are ready to be read by the error generator block.

The method may further include closing a calibration switch in response to a calibration signal to provide two reference analog signals to the ADC block, and storing an offset digital conversion code corresponding to the two reference analog signals in a calibration register.

The method may further include subtracting the offset digital conversion code to generate a calibrated digital conversion code corresponding to the two analog input signals.

The above example embodiments have been described hereinabove to illustrate various embodiments of implementing a system and method for converting an analog error signal to a digital error signal with multiple symmetric transfer functions. Various modifications and departures from the disclosed example embodiments will occur to those having ordinary skill in the art. The subject matter that is intended to be within the scope of the invention is set forth in the following claims.

What is claimed is:

1. An analog-to-digital conversion (ADC) block comprising:
   an amplifier block configured to receive two analog input signals and a primary-precision configuration signal and generate a first pair of differential signals by amplifying the two analog input signals according to a primary-precision gain that is programmably set by the primary-precision configuration signal;
   a configuration block configured to receive a fractional-precision configuration signal and generate a second pair of differential signals by amplifying the first pair of differential signals according to a fractional-precision gain that is programmably set by the fractional-precision configuration signal; and
   a differential analog-to-digital converter (ADC) comprising a voltage-controlled oscillator (VCO), two counters, and an error generator block,
   wherein the VCO receives the second pair of differential signals and generates two pulse signals having frequencies that vary depending on a difference between the second pair of differential signals, wherein each of the two counters receives a respective pulse signal from the VCO and generates a digital counter value, and wherein the error generator block receives digital counter values from the two digital counters and generates a digital conversion code corresponding to a difference between the digital counter values.

2. The ADC block of claim 1, wherein the primary-precision configuration signal and the plurality of fractional-precision configuration signals are received from a programmable fabric of a programmable logic device (PLD).

3. The ADC block of claim 1, wherein the differential ADC further comprises a first ADC including a first VCO and a second ADC including a second VCO, and the first VCO and the second VCO have different precision settings for converting the two analog input signals based on the primary-precision configuration signal and a plurality of fractional-precision configuration signals.

4. The ADC block of claim 1, wherein the amplifier block comprises one or more resistors and one or more multiplexers corresponding to the one or more resistors, each of the one or more multiplexers is configured to programmably adjust a ratio of a corresponding resistor by connecting to a tapping point among a predetermined set of tapping points based on the primary-precision configuration signal, and each tapping point of the predetermined set of tapping points provides a different ratio of the corresponding resistor.

5. The ADC block of claim 4, wherein the amplifier block further comprises an amplifier that generates the first pair of differential signals based on ratios of the one or more resistors.

6. The ADC block of claim 1, wherein the configuration block comprises two resistors and four multiplexers, and each of the four multiplexer is configured to programmably adjust a ratio of a corresponding resistor by connecting to a tapping point among a predetermined set of tapping points based on the fractional-precision configuration signal, and each tapping point of the predetermined set of tapping points provides a different ratio of the corresponding resistor.

7. The ADC block of claim 1, wherein the VCO included in the differential ADC comprises: a voltage-to-current converter and two current-controlled oscillators (ICOs).

8. The ADC block of claim 7, wherein the two ICOs are arranged from a substantially equal distance from ICO mirror circuits and receive current inputs from the ICO mirror circuits through transistor legs, wherein the two ICOs are separated from each other by a separation area, and wherein the transistor legs feeding the current inputs from the ICO mirror circuits are positioned in the separation area.

9. The ADC block of claim 1, wherein the differential ADC further comprises: two clock latch blocks and two counter latch blocks.

10. The ADC block of claim 1, further comprising a calibration switch and a calibration register, wherein the calibration switch is closed in response to a calibration signal to provide two reference analog signals to the ADC block, and the error generator block is configured to store an offset digital conversion code corresponding to the two reference analog signals in the calibration register.

11. The ADC block of claim 10, wherein the error generator block is configured to subtract the offset digital conversion code to generate a calibrated digital conversion code corresponding to the two analog input signals.

12. A method comprising:
receiving two analog input signals, a primary-precision configuration signal, and a fractional-precision configuration signal;
generating a first pair of differential signals by amplifying the two analog input signals according to a primary-precision gain that is programmably set by the primary-precision configuration signal;
generating a second pair of differential signals by amplifying the first pair of differential signals according to a fractional-precision gain that is programmably set by the fractional-precision configuration signal; and
converting the second pair of differential signals to a digital conversion code corresponding to a difference between the two analog input signals using a differential analog-to-digital converter (ADC),
wherein the differential ADC comprises a voltage-controlled oscillator (VCO), two counters, and an error generator block, and
wherein the VCO included in the ADC receives the second pair of differential signals and generates two pulse signals having frequencies that vary depending on a difference between the second pair of differential signals, wherein each of the two counters receives a respective pulse signal of the two pulse signals from the VCO and generates a digital counter value, and wherein the error generator block receives digital counter values from the two counters and generates a digital conversion code corresponding to a difference between the two digital counter values.

13. The method of claim 12, wherein the primary-precision configuration signal and the plurality of fractional-precision configuration signals are received from a programmable fabric of a programmable logic device (PLD).

14. The method of claim 12, wherein the differential ADC further comprises a first ADC including a first VCO and a second ADC including a second VCO, and the method further comprising: setting different precision setting for the first VCO and the second VCO based on the primary-precision configuration signal and a plurality of fractional-precision configuration signals.

15. The method of claim 12, further comprising: programmably adjusting a ratio of a resistor by connecting to a tapping point among a predetermined set of tapping points based on the primary-precision configuration signal, wherein each tapping point of the predetermined set of tapping points provides a different ratio of the corresponding resistor.

16. The method of claim 12, wherein the VCO further comprises: a voltage-to-current converter, two current-controlled oscillators (ICOs), and the differential ADC further comprises two clock latch blocks connected between the two ICOs and the two counters, the method further comprising: latching the two clock latch blocks at an expiry of a sampling period and halting clocks of the two ICOs after a first delay from the latching of the two clock latch blocks.

17. The method of claim 16, wherein the differential ADC further comprises two counter latch blocks between the two counters and the error generator block, the method further comprising: generating a pulse signal to the two counter latch blocks to capture the digital counter values after a second delay from the first delay.

18. The method of claim 16, further comprising:
receiving a programable count value;
comparing the digital counter values against the programmable count value; and
generating a latching signal to latch the two clock latch blocks when one of the digital counter values reaches the programmable count value indicating the expiry of the sampling period.

19. The method of claim 16, further comprising:
receiving a programable time value; and
generating a latching signal to latch the two clock latch blocks when the sampling period reaches over the programmable time value indicating the expiry of the sampling period.

20. The method of claim 12, further comprising: generating a ready signal indicating that the digital counter values are ready to be read by the error generator block.

21. The method of claim 12, further comprising closing a calibration switch in response to a calibration signal to provide two reference analog signals to the ADC block, storing an offset digital conversion code corresponding to the two reference analog signals in a calibration register.

22. The method of claim 21, further comprising: subtracting the offset digital conversion code to generate a calibrated digital conversion code corresponding to the two analog input signals.

* * * * *